(12) United States Patent
de Jongh

(10) Patent No.: US 9,438,223 B2
(45) Date of Patent: Sep. 6, 2016

(54) TRANSISTOR BASED SWITCH STACK HAVING FILTERS FOR PRESERVING AC EQUIPOTENTIAL NODES

(71) Applicant: QUALCOMM Incorporated, San Diego, CA (US)

(72) Inventor: Maurice Adrianus de Jongh, Nijmegen (NL)

(73) Assignee: Qualcomm Incorporated, San Diego, CA (US)

(*) Notice: Subject to any disclaimer, the term of this patent is extended or adjusted under 35 U.S.C. 154(b) by 49 days.

(21) Appl. No.: 14/281,965

(22) Filed: May 20, 2014

(65) Prior Publication Data

US 2015/0341026 A1    Nov. 26, 2015

(51) Int. Cl.
*H03K 3/012*       (2006.01)
*H04B 1/40*        (2015.01)
*H03K 17/16*       (2006.01)
*H03K 17/10*       (2006.01)

(52) U.S. Cl.
CPC ............ *H03K 17/161* (2013.01); *H03K 3/012* (2013.01); *H03K 17/162* (2013.01); *H04B 1/40* (2013.01); *H03K 17/102* (2013.01); *H03K 2217/0018* (2013.01); *H03K 2217/0054* (2013.01)

(58) Field of Classification Search
CPC ... H01L 27/00; H01L 27/0218; H03K 17/00; H03K 17/161; H03K 17/162; H03K 17/6872; H03K 17/6874; H03K 19/00; H03K 19/00361; H03K 3/00; H03K 3/012; H04B 1/00; H04B 1/40
USPC ........................................................ 327/382
See application file for complete search history.

(56) References Cited

U.S. PATENT DOCUMENTS

| | | | |
|---|---|---|---|
| 6,730,953 B2 | 5/2004 | Brindle et al. | |
| 8,008,988 B1* | 8/2011 | Yang | H03K 17/693 333/101 |
| 8,081,928 B2 | 12/2011 | Kelly | |
| 8,395,435 B2 | 3/2013 | Cassia et al. | |
| 8,405,147 B2 | 3/2013 | Brindle et al. | |
| 8,461,903 B1 | 6/2013 | Granger-Jones | |
| 8,536,636 B2 | 9/2013 | Englekirk | |
| 8,649,754 B2 | 2/2014 | Burgener et al. | |

(Continued)

FOREIGN PATENT DOCUMENTS

| | | |
|---|---|---|
| JP | 5348239 B2 | 11/2013 |
| WO | 2009108391 A1 | 9/2009 |
| WO | 2014011510 A2 | 1/2014 |
| WO | 2014202137 A1 | 12/2014 |

OTHER PUBLICATIONS

Takahashi, High-Frequency Switch Circuit, Nov. 20, 2013, JP 5348239 (B2), JP5348239 Trans.pdf.*

(Continued)

*Primary Examiner* — John Poos
*Assistant Examiner* — David Mattison
(74) *Attorney, Agent, or Firm* — Smith Tempel Blaha LLC

(57) ABSTRACT

A device for switching a radio frequency (RF) signal includes two or more field-effect transistor (FET) unit cells in a stacked or chain topology, and gate or body node filtration circuitry that preserves RF equipotential nodes. The filtration circuitry may be capacitive or resistive-capacitive. The filtration circuitry may be included in each unit cell of the device or in a gate or body bias network that is common to all unit cells in the device.

15 Claims, 25 Drawing Sheets

(56) References Cited

U.S. PATENT DOCUMENTS

| | | | | |
|---|---|---|---|---|
| 2004/0228056 | A1* | 11/2004 | Vice | H03K 17/102 361/100 |
| 2013/0249619 | A1 | 9/2013 | Granger-Jones | |
| 2014/0009213 | A1* | 1/2014 | Sprinkle | H03K 17/161 327/427 |
| 2014/0009214 | A1 | 1/2014 | Altunkilic et al. | |
| 2014/0118053 | A1* | 5/2014 | Matsuno | H03K 17/693 327/427 |

OTHER PUBLICATIONS

International Search Report and Written Opinion—PCT/US2015/030737—ISA/EPO—Aug. 6, 2015.
Tanaka S., et al., "A 3V MMIC Chip Set for 1.9GHz Mobile Communication Systems," IEEE International Solid-State Circuits Conference, Session 8, 1995, pp. 144-145.

\* cited by examiner

TRANSISTOR BASED SWITCH STACK HAVING FILTERS FOR PRESERVING AC EQUIPOTENTIAL NODES

BACKGROUND

1. Field

The present disclosure relates generally to radio frequency (RF) switching and, more specifically, to transistor-based RF switch stacks.

2. Background

Electronic switches are commonly based on transistors, such as field-effect transistors (FETs). In RF applications such as mobile phones, which have high RF transmission output power, the RF voltage swing can be higher than the maximum voltage that one single FET can handle. As illustrated in FIG. 1, a conventional device 10 for switching RF signals includes two or more FETs 12, 14, 16, 18, etc., connected in a stack or chain topology in which the source terminal of a FET is connected directly to the drain terminal of an adjacent FET in the chain. In FIG. 1, further FETs in the chain between FETs 16 and 18 that are not shown for purposes of clarity are indicated by the ellipsis symbol (" . . . "). The gate node of each of FET 12-18, etc., is connected to a gate bias network 20, which also receives a switch control signal as an input. In response to the switch control signal, device 10 opens or closes a circuit between a first RF signal node ("RF1"), which is defined by the source node of the last FET 18 in the chain, and a second RF signal node ("RF2"), which is defined by the drain node of the first FET 12 in the chain. Device 10 is commonly referred to as a "switch stack" or "FET stack."

As illustrated in FIG. 2, a conventional device 22 similar to above-described device 10 includes two or more FETs 24, 26, 28, 30, etc., connected in the above-described stack or chain topology. The gate nodes of FETs 24-30, etc., are connected to a gate bias network 32 similar to above-described gate bias network 20. Each of FETs 24, 26, 28, 30 etc., also includes a body node that is connected to a body bias network 34. As understood by one of ordinary skill in the art, some semiconductor technologies, such as partially depleted silicon-on-insulator ("SOI"), provide such a body node, while others, such as gallium arsenide ("GaAs") pseudomorphic high-electron mobility transistor ("pHEMT") and floating-body and fully depleted SOI, do not provide such a body node. Devices that provide a FET body node are commonly called body contact devices. Although not shown, a drain-source bias network, such as a resistor between the drain and source nodes of each of FETs 24, 26, 28, 30, etc., is also commonly included, and may be considered part of gate bias network 32 or body bias network 34.

The performance of switch stacks in mobile phone RF front end circuitry, such as the receive/transmit ("Rx/Tx") switch, is adversely affected by poor linearity. Linearity of a switch stack, as well as power handling capability, can be increased by increasing the number of FETs in the stack or chain. However, increasing the number of FETs can increase RF loss and decrease manufacturing economy.

BRIEF DESCRIPTION OF THE DRAWINGS

In the figures, like reference numerals refer to like parts throughout the various views unless otherwise indicated. For reference numerals with letter character designations such as "102a" or "102b", the letter character designations may differentiate two like parts or elements present in the same figure. Letter character designations for reference numerals may be omitted when it is intended that a reference numeral encompass all parts having the same reference numeral in all figures.

DETAILED DESCRIPTION

The word "exemplary" is used herein to mean "serving as an example, instance, or illustration." Any aspect described herein as "exemplary" is not necessarily to be construed as preferred or advantageous over other aspects. The term "coupled" with respect to two elements is used herein to mean that zero or more intermediate elements are interposed in the electrical circuit between the two elements. Two elements that are coupled to each other via zero intermediate elements are directly connected to each other.

Exemplary embodiments of the disclosure are directed toward switch stack devices that promote high linearity by promoting minimization of voltage imbalance between equipotential nodes, capacitance imbalance between equipotential nodes or both. As understood by one of ordinary skill in the art, and as further described below with regard to exemplary embodiments, equipotential nodes have the same RF voltage as each other in an "ideal case." For purposes of the present disclosure, "ideal case" refers to a switch stack device having maximum linearity. Voltage imbalance can be introduced by bias networks and can be caused by the combined effect of parasitic capacitance and common-mode current through bias resistors. Capacitance imbalance can be caused by parasitic capacitances. Exemplary embodiments described below include gate-node or body-node filtration circuitry that promotes preservation of RF equipotential nodes. As demonstrated through various exemplary embodiments described below, such filtration circuitry may be capacitive-based ("C-based") or resistive-capacitive-based ("RC-based"). As demonstrated through various exemplary embodiments described below, filtration circuitry may be included in each unit cell of the device or in a gate or body bias network that is common to all unit cells of the device. It should be understood that the capacitances of the filtration circuitry described below are in addition to those that may inherently exist in a FET, such as parasitic capacitances.

Figure 1:
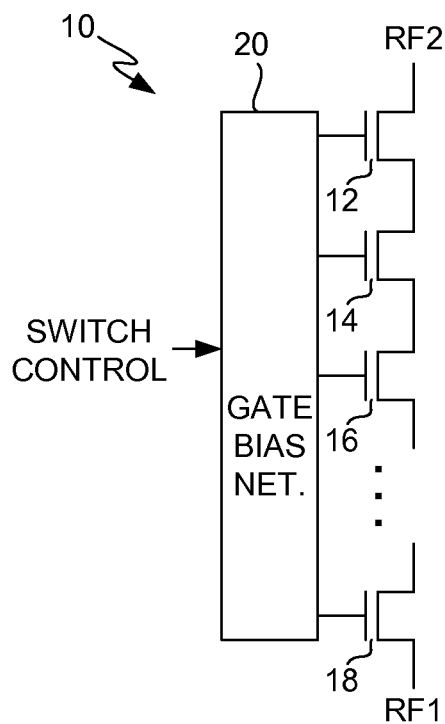
FIG. 1 is a circuit diagram showing a switch stack device, in accordance with the prior art.
Figure 2:
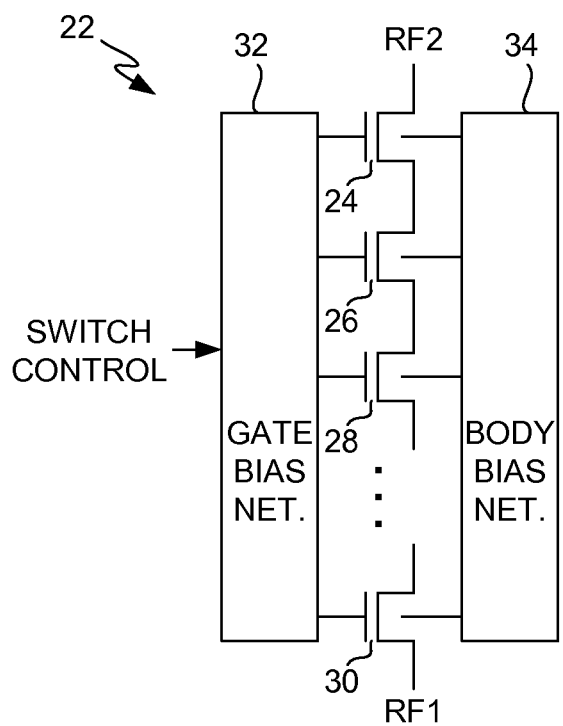
FIG. 2 is a circuit diagram showing another switch stack device, in accordance with the prior art.
Figure 3:
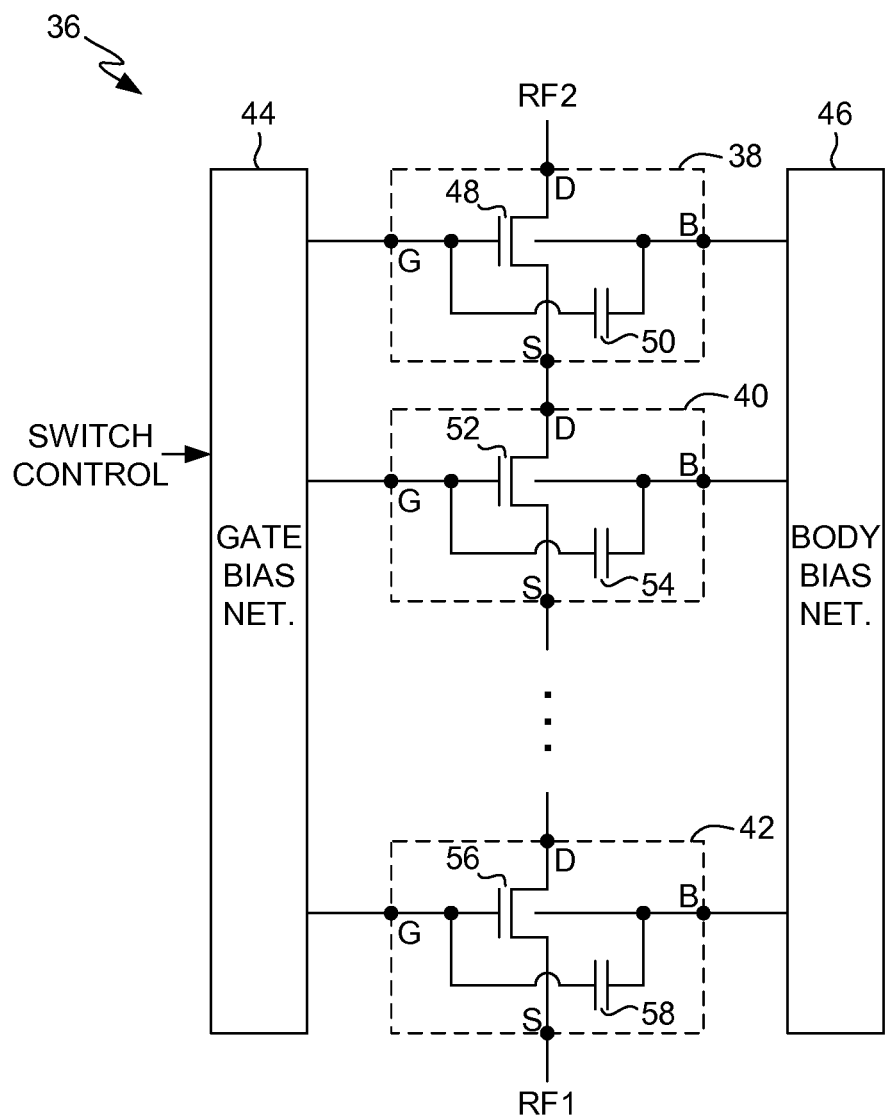
FIG. 3 is a circuit diagram illustrating a switch stack device having FET unit cell circuits with capacitance-based ("C-based") body filters, in accordance with a first exemplary embodiment.

As illustrated in FIG. 3, in a first exemplary embodiment a switch stack device 36 includes a first FET unit cell circuit 38, a second FET unit cell circuit 40, etc., through an Nth FET unit cell circuit 42, connected in a stack or chain topology, in which the cell source node ("S") of one of a pair of successive FET unit cell circuits in the chain is directly connected to the cell drain node ("D") of the other of the pair of successive FET unit cell circuits in the chain. For example, the cell source node of first FET unit cell circuit 38 is directly connected to the cell drain node of second FET unit cell circuit 40. Further FET unit cell circuits in the chain between second FET unit cell circuit 40 and Nth FET unit cell circuit 42 that are not shown for purposes of clarity are indicated by the ellipsis symbol (" . . . "). The cell source node of Nth FET unit cell circuit 42 is connected to a first RF signal node ("RF1"), and the cell drain node of first FET unit cell circuit 38 is connected to a second RF signal node ("RF2"). The number N of FET unit cell circuits 38-42 can be any number greater than one. Switch stack device 36 can be formed on a silicon-on-insulator (SOI) substrate or in any other suitable manner.

With regard to FET terminology, although in the exemplary embodiments described herein a FET node closer to the first RF signal node is referred to as the "source," and the opposite node as the "drain," this is not a requirement. As understood by one of ordinary skill in the art, FETs can be implemented in various designs and polarities (e.g., N-channel FETs and P-channel FETs, enhancement and depletion modes, various threshold voltages, etc.). Moreover, the circuits in which FETs are employed may be illustrated using different symbolic conventions than are followed herein. FET polarity and drain-source node orientation in some instances may be interchanged without significantly altering the principle of operation of a circuit. Rather than illustrate the numerous possible permutations of illustration conventions, FET polarities, and FET designs, it should be understood by one of ordinary skill in the art that the exemplary descriptions and figures illustrated herein encompass all such alternative circuit descriptions and equivalent device designs. It should specifically be understood that the term "drain node" in reference to a FET circuit connection also includes a source node within its scope of meaning, and the term "source node" in reference to a FET circuit connection also includes a drain node within its scope of meaning.

In the exemplary embodiment illustrated in FIG. 3, the cell gate node ("G") of each of FET unit cell circuits 38-42 is connected to a gate bias network filter circuit 44 that biases the cell gate nodes as well as provides filtering in a manner described below with regard to FIGS. 18-22. However, in other embodiments (not shown) the cell gate nodes of such FET unit cell circuits can be connected to any other type of gate bias network, such as one that does not provide filtering.

Gate bias network filter circuit 44 also receives a conventional switch control signal as an input and, although not shown, is connected to a source of one or more conventional bias voltages. In response to the switch control signal, switch stack device 36 opens or closes a circuit between RF1 and RF2. As the manner in which such a switch control signal can be coupled to gate bias circuitry to provide such a switching function is well understood by one of ordinary skill in the art, this conventional aspect is not described in further detail herein.

In the exemplary embodiment illustrated in FIG. 3, the cell body node ("B") of each of FET unit cell circuits 38-42 is connected to a body bias network filter circuit 46 that biases the cell body nodes as well as provides filtering in a manner described below with regard to FIGS. 13-17. However, in other embodiments (not shown) the cell body nodes of such FET unit cell circuits can be connected to any other type of body bias network, such as one that does not provide filtering. Although not shown, body bias network filter circuit 46 is also connected to a source of one or more bias voltages.

FET unit cell circuit 38 includes a FET 48 and a body filter. The body filter includes a body filter capacitance 50. Body filter capacitance 50 is coupled between the body node and the gate node of FET 48. Note that the drain node of FET 48 defines a cell drain node of FET unit cell circuit 38, i.e., a node that can be connected to circuitry external to FET unit cell circuit 38 in the same manner as though it were the drain node of FET 48. Similarly, the source node of FET 48 defines a cell source node of FET unit cell circuit 38, i.e., a node that can be connected to circuitry external to FET unit cell circuit 38 in the same manner as though it were the source node of FET 48. Likewise, the gate node of FET 48 defines a cell gate node of FET unit cell circuit 38, i.e., a node that can be connected to circuitry external to FET unit cell circuit 38 in the same manner as though it were the gate node of FET 48. Also, the body node of FET 48 defines a cell body node of FET unit cell circuit 38, i.e., a node that can be connected to circuitry external to FET unit cell circuit 38 in the same manner as though it were the body node of FET 48. But for the filtering effects described herein that promote linearity of switch stack device 36, each of FET unit cell circuits 38-42 behaves in a manner similar to a conventional FET.

The above-described structure of FET unit cell circuit 38 promotes linear operation in the following manner. The body node of FET 48 is very high impedant and also very non-linear compared with the gate node of FET 48. In an ideal case, i.e., to promote maximum linearity, both the body and gate nodes have exactly the same RF voltage, due to capacitive voltage division. In an ideal case, the body node and gate node of FET 48 have the same RF voltage potential, i.e., they are equipotential nodes at RF frequencies. Coupling body filter capacitance 50 between such equipotential nodes promotes preservation of this equipotential relationship. As body filter capacitance 50 is low-impedant with respect to the internal or inherent capacitance between the body and source nodes of FET 48 and with respect to the internal or inherent capacitance between the body and drain nodes of FET 48, body filter capacitance 50 filters the body node voltage by use of the gate node voltage. The main part of the RF current (common-mode and differential-mode) through body bias network filter circuit 46 is supplied from the gate node of FET 48 because a FET gate node is characteristically much lower impedant than a FET body node. In addition, the gate node (and thus the gate junctions) are more linear than the body junctions, thereby promoting linear behavior of FET unit cell circuit 38.

As each of the remaining N−1 FET unit cell circuits 40-42 has a structure identical to that of above-described FET unit cell circuit 38, FET unit cell circuits 40-42 are not described in similar detail. It can be noted that FET unit cell circuit 40 includes a FET 52 and a body filter capacitance 54 that are identical to above-described FET 48 and body filter capacitance 50, respectively. Likewise, FET unit cell circuit 42 includes a FET 56 and a body filter capacitance 58 that are identical to above-described FET 48 and body filter capacitance 50, respectively.

Figure 4:
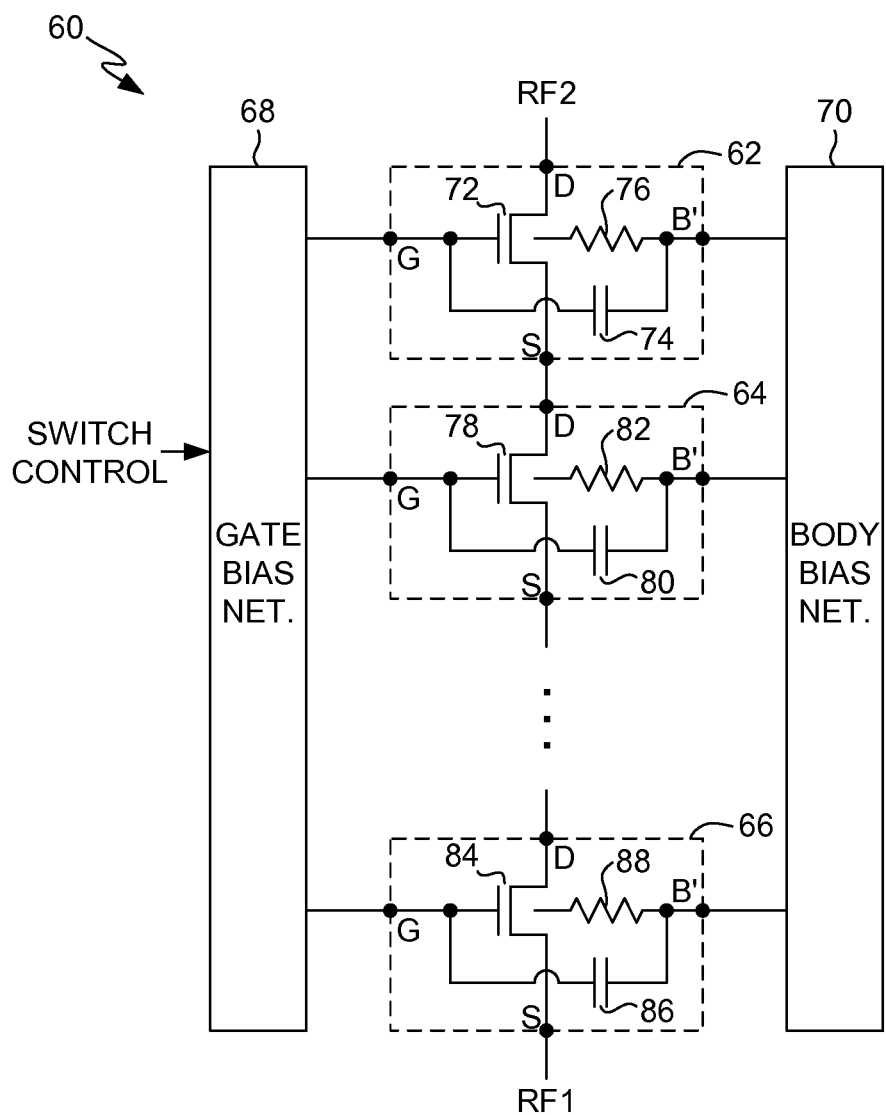
FIG. 4 is a circuit diagram illustrating a switch stack device having FET unit cell circuits with resistance-capacitance-based ("RC-based") body filters, in accordance with a second exemplary embodiment.

As illustrated in FIG. 4, in a second exemplary embodiment a switch stack device 60 includes a first FET unit cell circuit 62, a second FET unit cell circuit 64, etc., through an Nth FET unit cell circuit 66, connected in a stack or chain topology in the same manner as described above with regard to other embodiments. Further FET unit cell circuits in the chain between second FET unit cell circuit 64 and Nth FET unit cell circuit 66 that are not shown for purposes of clarity are indicated by the ellipsis symbol (" . . . "). The number N of FET unit cell circuits 62-66 can be any number greater than one. Switch stack device 60 can be formed on an SOI substrate or in any other suitable manner.

In the exemplary embodiment illustrated in FIG. 4, the cell gate node of each of FET unit cell circuits 62-66 is connected to a gate bias network filter circuit 68 that biases the cell gate nodes as well as provides filtering in a manner described below with regard to FIGS. 18-22. However, in other embodiments (not shown) the cell gate nodes of such FET unit cell circuits can be connected to any other type of gate bias network, such as one that does not provide filtering. Gate bias network filter circuit 68 also receives a conventional switch control signal as an input, which can be used to operate switch stack device 60 in the manner described above with regard to other embodiments. Although not shown, gate bias network filter circuit 68 is also connected to a source of one or more bias voltages.

In the exemplary embodiment illustrated in FIG. 4, the cell body node of each of FET unit cell circuits 62-66 is connected to a body bias network filter circuit 70 that biases the cell body nodes as well as provides filtering in a manner described below with regard to FIGS. 13-17. However, in other embodiments (not shown) the cell body nodes of such FET unit cell circuits can be connected to any other type of body bias network, such as one that does not provide filtering. Although not shown, body bias network filter circuit 70 is connected to a source of one or more bias voltages.

FET unit cell circuit 62 includes a FET 72 and a body filter. The body filter includes a body filter capacitance 74 and a body filter resistance 76. Body filter capacitance 74 and body filter resistance 76 are in series with each other and coupled between the body node and the gate node of FET 72. Note that the drain node of FET 72 defines a cell drain node of FET unit cell circuit 62, the source node of FET 72 defines a cell source node of FET unit cell circuit 38, and the gate node of FET 72 defines a cell gate node of FET unit cell circuit 62. However, the cell body node of FET unit cell circuit 62 is defined not by the body node of FET 72 but rather by a virtual node (B') between body filter capacitance 74 and a body filter resistance 76.

The above-described structure of FET unit cell circuit 38 promotes linear operation in a manner similar to that described above with regard to the embodiment illustrated in FIG. 3. More specifically, the RC-based body filter comprising body filter capacitance 74 and a body filter resistance 76 provides an effect that is similar to the above-described effect provided by the C-based body filter comprising body filter capacitance 50 in the embodiment illustrated in FIG. 3.

As each of the remaining N−1 FET unit cell circuits 64-66 has a structure identical to that of above-described FET unit cell circuit 62, FET unit cell circuits 64-66 are not described in similar detail. It can be noted that FET unit cell circuit 64 includes a FET 78, a body filter capacitance 80, and a body filter resistance 82 that are identical to above-described FET 72, body filter capacitance 74, and body filter resistance 76, respectively. Likewise, FET unit cell circuit 66 includes a FET 84, a body filter capacitance 86, and a body filter resistance 88 that are identical to above-described FET 72, body filter capacitance 74, and body filter resistance 76, respectively.

Figure 5:
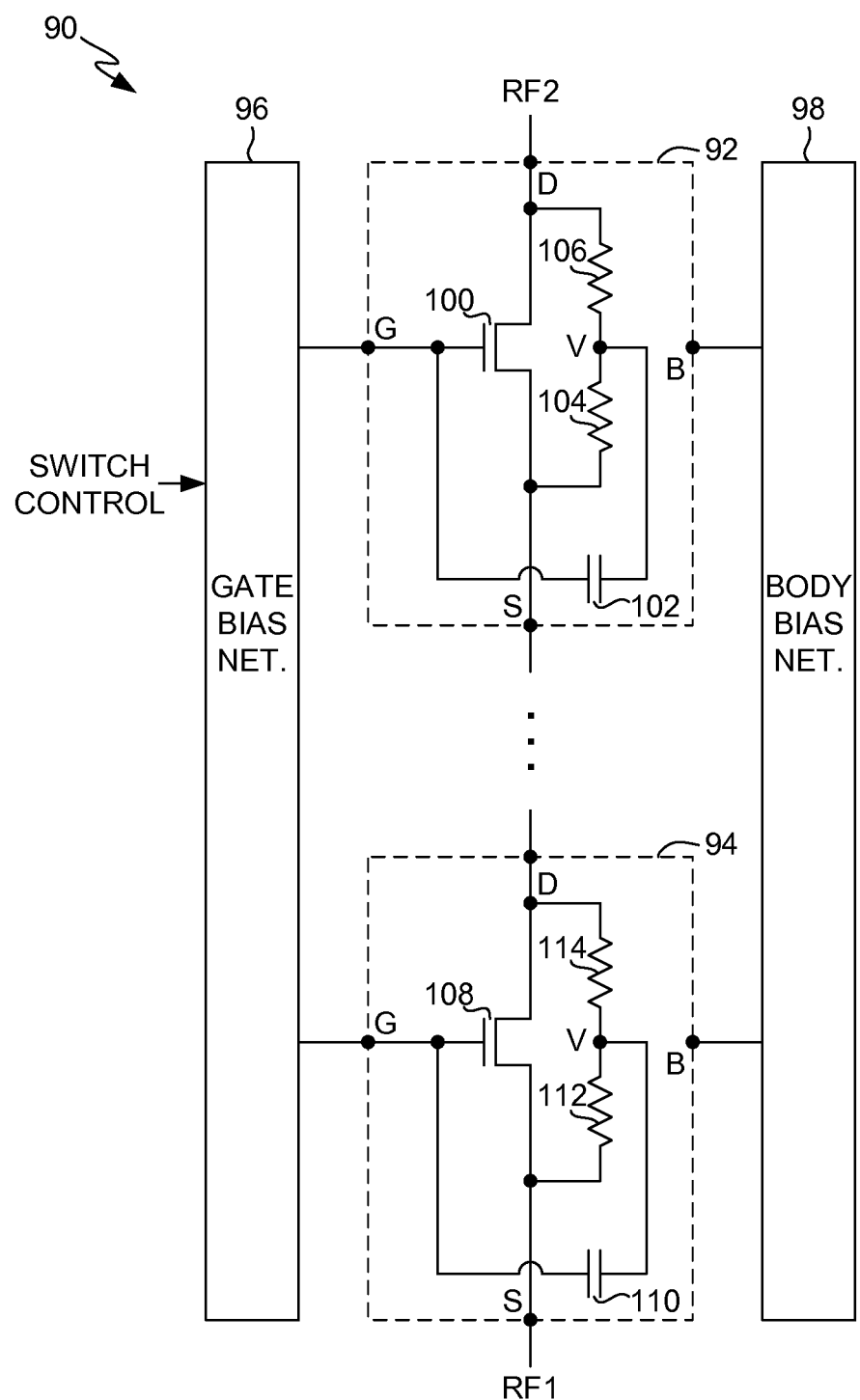
FIG. 5 is a circuit diagram illustrating a switch stack device having FET unit cell circuits with C-based gate filters, in accordance with a third exemplary embodiment.

As illustrated in FIG. 5, in a third exemplary embodiment a switch stack device 90 includes a first FET unit cell circuit 92 through an Nth FET unit cell circuit 94, connected in a stack or chain topology in the same manner as described above with regard to other embodiments. Further FET unit cell circuits in the chain between first FET unit cell circuit 92 and Nth FET unit cell circuit 94 that are not shown for purposes of clarity are indicated by the ellipsis symbol (" . . . "). The number N of FET unit cell circuits 92-94 can be any number greater than one. Switch stack device 90 can be formed on an SOI substrate or in any other suitable manner.

In the exemplary embodiment illustrated in FIG. 5, the cell gate node of each of FET unit cell circuits 92-94 is connected to a gate bias network filter circuit 96 that biases the cell gate nodes as well as provides filtering in a manner described below with regard to FIGS. 18-22. However, in other embodiments (not shown) the cell gate nodes of such FET unit cell circuits can be connected to any other type of gate bias network, such as one that does not provide filtering. Gate bias network filter circuit 96 also receives a conventional switch control signal as an input, which can be used to operate switch stack device 90 in the manner described above with regard to other embodiments. Although not shown, gate bias network filter circuit 96 is also connected to a source of one or more bias voltages.

In the exemplary embodiment illustrated in FIG. 5, the cell body node of each of FET unit cell circuits 92-94 is connected to a body bias network filter circuit 98 that biases the cell body nodes as well as provides filtering in a manner described below with regard to FIGS. 13-17. However, in other embodiments (not shown) the cell body nodes of such FET unit cell circuits can be connected to any other type of body bias network, such as one that does not provide filtering. Although not shown, body bias network filter circuit 98 is connected to a source of one or more bias voltages.

FET unit cell circuit 92 includes a FET 100 and a gate filter. The gate filter includes a gate filter capacitance 102 and a drain-source circuit. The drain-source circuit is connected between the drain and source nodes of FET 100 and comprises a resistive divider circuit having a first resistance 104 in series with a second resistance 106. The resistive divider circuit defines a virtual node ("V") between first resistance 104 and second resistance 106. Gate filter capacitance 102 is coupled between the gate node of FET 100 and this virtual node V.

Note that the drain node of FET 100 defines a cell drain node of FET unit cell circuit 92, the source node of FET 100 defines a cell source node of FET unit cell circuit 92, the gate node of FET 100 defines a cell gate node of FET unit cell circuit 92, and the body node of FET 100 defines a cell body node of FET unit cell circuit 92. (The body node of FET 100 and the connection between it and the cell body node of FET unit cell circuit 92 are not shown for purposes of clarity.) Note that in embodiments (not shown) in which such a FET does not include a body node, neither body bias network filter circuit 98 nor other body bias network need be included. Thus, FET unit cell circuits 92-94 are also suitable for embodiments in which the FET technology does not provide a body node.

The above-described structure of FET unit cell circuit 92 promotes linear operation in a manner similar to that described above with regard to the embodiments illustrated in FIGS. 3-4, except that in the embodiment illustrated in FIG. 5 the filtering is applied to the FET gate nodes, while in the embodiments illustrated in FIGS. 3-4 the filtering is applied to the FET body nodes. The C-based gate filter comprising gate filter capacitance 102 provides an effect that is similar to the above-described effect provided by C-based and RC-based body filters in the embodiments illustrated in FIGS. 3 and 4, respectively.

As each of the remaining N−1 FET unit cell circuits 94, etc., has a structure identical to that of above-described FET unit cell circuit 92, they are not described in similar detail. It can be noted that FET unit cell circuit 94 includes a FET 108, a gate filter capacitance 110, and a drain-source bias circuit comprising first and second resistances 112 and 114, which are identical to above-described FET 100, gate filter capacitance 102, and resistances 104 and 106, respectively.

Figure 6:
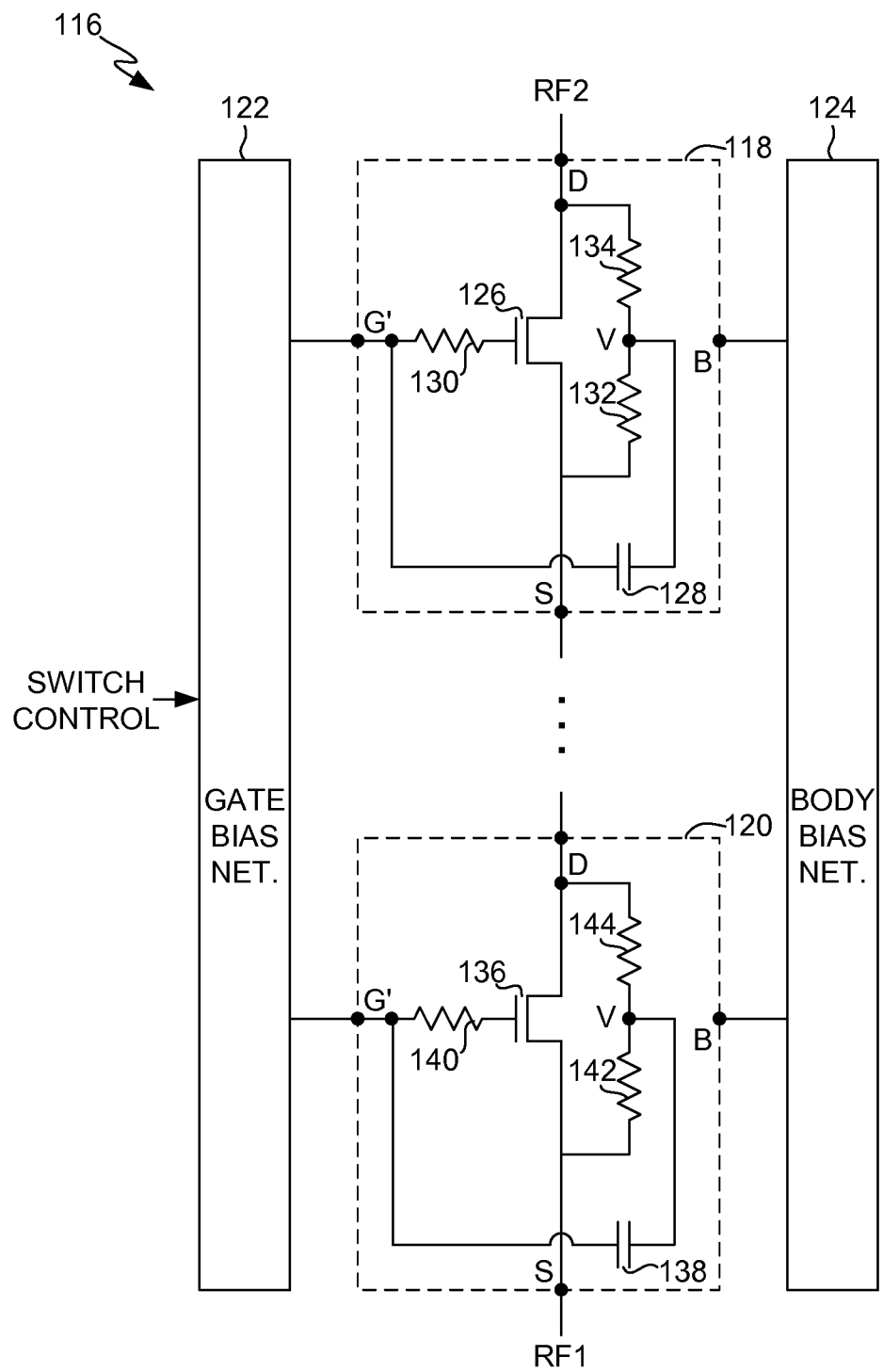
FIG. 6 is a circuit diagram illustrating a switch stack device having FET unit cell circuits with RC-based gate filters, in accordance with a fourth exemplary embodiment.

As illustrated in FIG. 6, in a fourth exemplary embodiment a switch stack device 116 includes a first FET unit cell circuit 118 through an Nth FET unit cell circuit 120, connected in a stack or chain topology in the same manner as described above with regard to other embodiments. Further FET unit cell circuits in the chain between first FET unit cell circuit 118 and Nth FET unit cell circuit 120 that are not shown for purposes of clarity are indicated by the ellipsis symbol (" . . . "). The number N of FET unit cell circuits 118-120 can be any number greater than one. Switch stack device 116 can be formed on an SOI substrate or in any other suitable manner.

In the exemplary embodiment illustrated in FIG. 6, the cell gate node of each of FET unit cell circuits 118-120 is connected to a gate bias network filter circuit 122 that biases the cell gate nodes as well as provides filtering in a manner described below with regard to FIGS. 18-22. However, in other embodiments (not shown) the cell gate nodes of such FET unit cell circuits can be connected to any other type of gate bias network, such as one that does not provide filtering. Gate bias network filter circuit 122 also receives a conventional switch control signal as an input, which can be used to operate switch stack device 116 in the manner described above with regard to other embodiments. Although not shown, gate bias network filter circuit 122 is also connected to a source of one or more bias voltages.

In the exemplary embodiment illustrated in FIG. 6, the cell body node of each of FET unit cell circuits 118-120 is connected to a body bias network filter circuit 124 that biases the cell body nodes as well as provides filtering in a manner described below with regard to FIGS. 13-17. However, in other embodiments (not shown) the cell body nodes of such FET unit cell circuits can be connected to any other type of body bias network, such as one that does not provide filtering. Although not shown, body bias network filter circuit 124 is connected to a source of one or more bias voltages.

FET unit cell circuit 118 includes a FET 126 and a gate filter. The gate filter includes a gate filter capacitance 128, a gate filter resistance 130, and a drain-source circuit. The drain-source circuit is connected between the drain and source nodes of FET 126 and comprises a resistive divider circuit having a first resistance 132 in series with a second resistance 134. The resistive divider circuit defines a virtual node V between first resistance 132 and second resistance 134. Gate filter capacitance 128 and gate filter resistance 130 are in series with each other and coupled between the gate node of FET 126 and this virtual node V.

Note that the drain node of FET 126 defines a cell drain node of FET unit cell circuit 118, the source node of FET 126 defines a cell source node of FET unit cell circuit 118, and the body node of FET 126 defines a cell body node of FET unit cell circuit 118. (The body node of FET 126 and the connection between it and the cell body node of FET unit cell circuit 118 are not shown for purposes of clarity.) However, the cell gate node (G') of FET unit cell circuit 118 is defined not by the gate node of FET 126 but rather by another virtual (gate) node between gate filter capacitance 128 and gate filter resistance 130. Note that in embodiments (not shown) in which such a FET does not include a body node, neither body bias network filter circuit 124 nor other body bias network need be included. Thus, FET unit cells circuits 118-120 are also suitable for embodiments in which the FET technology does not provide a body node.

The above-described structure of FET unit cell circuit 118 promotes linear operation in a manner similar to that described above with regard to the embodiment illustrated in FIG. 5. The RC-based gate filter comprising gate filter capacitance 128 and gate filter resistance 130 provides an effect that is similar to the above-described effect provided by the C-based gate filter in the embodiment illustrated in FIG. 5.

As each of the remaining N−1 FET unit cell circuits 120, etc., has a structure identical to that of above-described FET unit cell circuit 118, they are not described in similar detail. It can be noted that FET unit cell circuit 120 includes a FET 136, a gate filter capacitance 138, a gate filter resistance 140, and a drain-source bias circuit comprising first and second resistances 142 and 144, which are identical to above-described FET 126, gate filter capacitance 128, gate filter resistance 130, and resistances 132 and 134, respectively.

Figure 7:
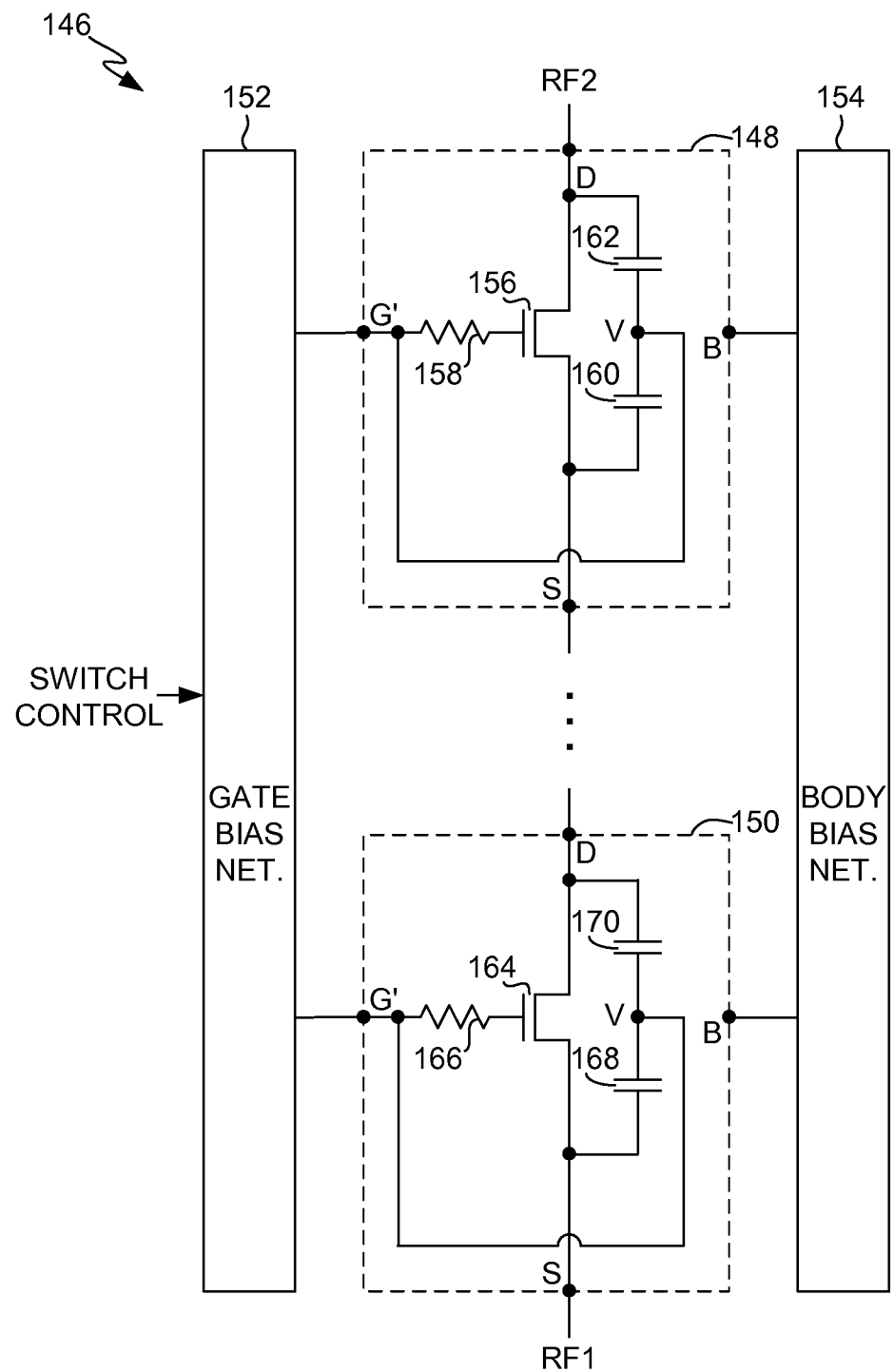
FIG. 7 is a circuit diagram illustrating a switch stack device having FET unit cell circuits with RC-based gate filters, in accordance with a fifth exemplary embodiment.

As illustrated in FIG. 7, in a fifth exemplary embodiment a switch stack device 146 includes a first FET unit cell circuit 148 through an Nth FET unit cell circuit 150, connected in a stack or chain topology in the same manner as described above with regard to other embodiments. Further FET unit cell circuits in the chain between first FET unit cell circuit 148 and Nth FET unit cell circuit 150 that are not shown for purposes of clarity are indicated by the ellipsis symbol (" . . . "). The number N of FET unit cell circuits 148-150 can be any number greater than one. Switch stack device 146 can be formed on an SOI substrate or in any other suitable manner.

In the exemplary embodiment illustrated in FIG. 7, the cell gate node of each of FET unit cell circuits 148-150 is connected to a gate bias network filter circuit 152 that biases the cell gate nodes as well as provides filtering in a manner described below with regard to FIGS. 18-22. However, in other embodiments (not shown) the cell gate nodes of such FET unit cell circuits can be connected to any other type of gate bias network, such as one that does not provide filtering.

Gate bias network filter circuit 152 also receives a conventional switch control signal as an input, which can be used to operate switch stack device 146 in the manner described above with regard to other embodiments. Although not shown, gate bias network filter circuit 152 is also connected to a source of one or more bias voltages.

The cell body node of each of FET unit cell circuits 148-150 is connected to a body bias network filter circuit 154 that biases the cell body nodes as well as provides filtering in a manner described below with regard to FIGS. 13-17. However, in other embodiments (not shown) the cell body nodes of such FET unit cell circuits can be connected to any other type of body bias network, such as one that does not provide filtering. Although not shown, body bias network filter circuit 154 is connected to a source of one or more bias voltages.

FET unit cell circuit 148 includes a FET 156 and a gate filter. The gate filter includes a gate filter resistance 158 and a drain-source circuit. The drain-source circuit is connected between the drain and source nodes of FET 156 and comprises a first gate filter capacitance 160 in series with a second gate filter capacitance 162. This drain-source circuit defines a virtual node V between first gate filter capacitance 160 and second gate filter capacitance 162. Gate filter resistance 158 is coupled between the gate node of FET 156 and this virtual node V.

Note that the drain node of FET 156 defines a cell drain node of FET unit cell circuit 148, the source node of FET 156 defines a cell source node of FET unit cell circuit 148, and the body node of FET 156 defines a cell body node of FET unit cell circuit 148. (The body node of FET 156 and the connection between it and the cell body node of FET unit cell circuit 148 are not shown for purposes of clarity.) However, the cell gate node (G') of FET unit cell circuit 148 is defined not by the gate node of FET 156 but rather by another virtual (gate) node between gate filter resistance 158 and the drain-source circuit comprising gate filter capacitances 160 and 162. Note that in embodiments (not shown) in which such a FET does not include a body node, neither body bias network filter circuit 154 nor other body bias network need be included. Thus, FET unit cells circuits 148-150 are also suitable for embodiments in which the FET technology does not provide a body node.

The above-described structure of FET unit cell circuit 148 promotes linear operation in a manner similar to that described above with regard to the embodiment illustrated in FIG. 6. The RC-based gate filter comprising gate filter resistance 158 and gate filter capacitances 160 and 162 provides an effect that is similar to the above-described effect provided by the RC-based gate filter in the embodiment illustrated in FIG. 6.

As each of the remaining N−1 FET unit cell circuits 150, etc., has a structure identical to that of above-described FET unit cell circuit 148, they are not described in similar detail. It can be noted that FET unit cell circuit 150 includes a FET 164, a gate filter resistance 166, and a drain-source bias circuit comprising first and second gate filter capacitances 168 and 170, which are identical to above-described FET 156, a gate filter resistance 158, and first and second gate filter capacitances 160 and 162, respectively.

Figure 8:
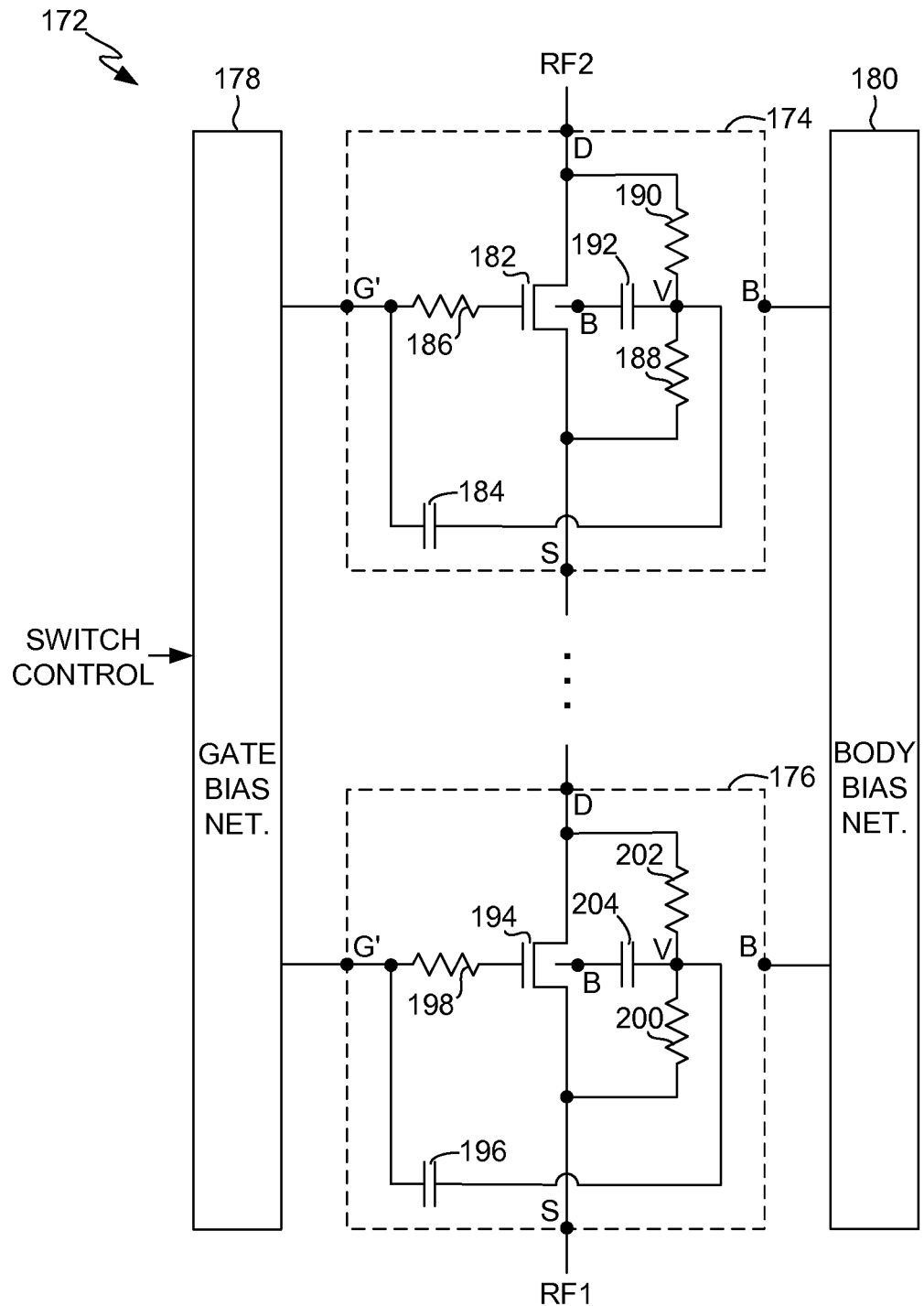
FIG. 8 is a circuit diagram illustrating a switch stack device having FET unit cell circuits with RC-based gate filters and C-based body filters, in accordance with a sixth exemplary embodiment.

As illustrated in FIG. 8, in a sixth exemplary embodiment a switch stack device 172 includes a first FET unit cell circuit 174 through an Nth FET unit cell circuit 176, connected in a stack or chain topology in the same manner as described above with regard to other embodiments. Further FET unit cell circuits in the chain between first FET unit cell circuit 174 and Nth FET unit cell circuit 176 that are not shown for purposes of clarity are indicated by the ellipsis symbol ("..."). The number N of FET unit cell circuits 174-176 can be any number greater than one. Switch stack device 172 can be formed on an SOI substrate or in any other suitable manner.

In the exemplary embodiment illustrated in FIG. 8, the cell gate node of each of FET unit cell circuits 174-176 is connected to a gate bias network filter circuit 178 that biases the cell gate nodes as well as provides filtering in a manner described below with regard to FIGS. 18-22. However, in other embodiments (not shown) the cell gate nodes of such FET unit cell circuits can be connected to any other type of gate bias network, such as one that does not provide filtering. Gate bias network filter circuit 178 also receives a conventional switch control signal as an input, which can be used to operate switch stack device 172 in the manner described above with regard to other embodiments. Although not shown, gate bias network filter circuit 178 is also connected to a source of one or more bias voltages.

The cell body node of each of FET unit cell circuits 174-176 is connected to a body bias network filter circuit 180 that biases the cell body nodes as well as provides filtering in a manner described below with regard to FIGS. 13-17. However, in other embodiments (not shown) the cell body nodes of such FET unit cell circuits can be connected to any other type of body bias network, such as one that does not provide filtering. Although not shown, body bias network filter circuit 180 is connected to a source of one or more bias voltages.

FET unit cell circuit 174 includes a FET 182, a gate filter, and a body filter. The gate filter includes a gate filter capacitance 184, a gate filter resistance 186, and a drain-source circuit. The drain-source circuit is connected between the drain and source nodes of FET 182 and comprises resistive divider circuit having a first resistance 188 in series with a second resistance 190. This drain-source circuit defines a virtual node V between first and second resistances 188 and 190. Gate filter capacitance 184 and gate filter resistance 186 are in series with each other and coupled between the gate node of FET 182 and the virtual node V. The body filter includes a body filter capacitance 192 coupled between the body node of FET 182 and the virtual node V (and thus also coupled between the body node of FET 182 and the gate node of FET 182).

Note that the drain node of FET 182 defines a cell drain node of FET unit cell circuit 174, the source node of FET 182 defines a cell source node of FET unit cell circuit 174, and the body node of FET 182 defines a cell body node of FET unit cell circuit 174. (It should be understood that the body node of FET 182 and the cell body node of FET unit cell circuit 174 are the same node B, though a connection is not explicitly shown for purposes of clarity.) However, the cell gate node (G') of FET unit cell circuit 174 is defined not by the gate node of FET 182 but rather by another virtual (gate) node between gate filter capacitance 184 and gate filter resistance 186.

The structure of FET unit cell circuit 174 promotes linear operation in a manner similar to that described above with regard to other embodiments. The combination of an RC-based gate filter and an RC-based body filter provides an effect that is similar to the above-described effect provided by the RC-based gate filters and RC-based body filters in other embodiments described above.

As each of the remaining N−1 FET unit cell circuits 176, etc., has a structure identical to that of above-described FET unit cell circuit 174, they are not described in similar detail. It can be noted that FET unit cell circuit 176 includes a FET 194, a gate filter capacitance 196, a gate filter resistance 198, a drain-source bias circuit comprising first and second resistances 200 and 202, and a body filter capacitance 204, which are identical to above-described FET 182, gate filter capacitance 184, gate filter resistance 186, first and second resistances 188 and 190, and body filter capacitance 192, respectively.

Figure 9:
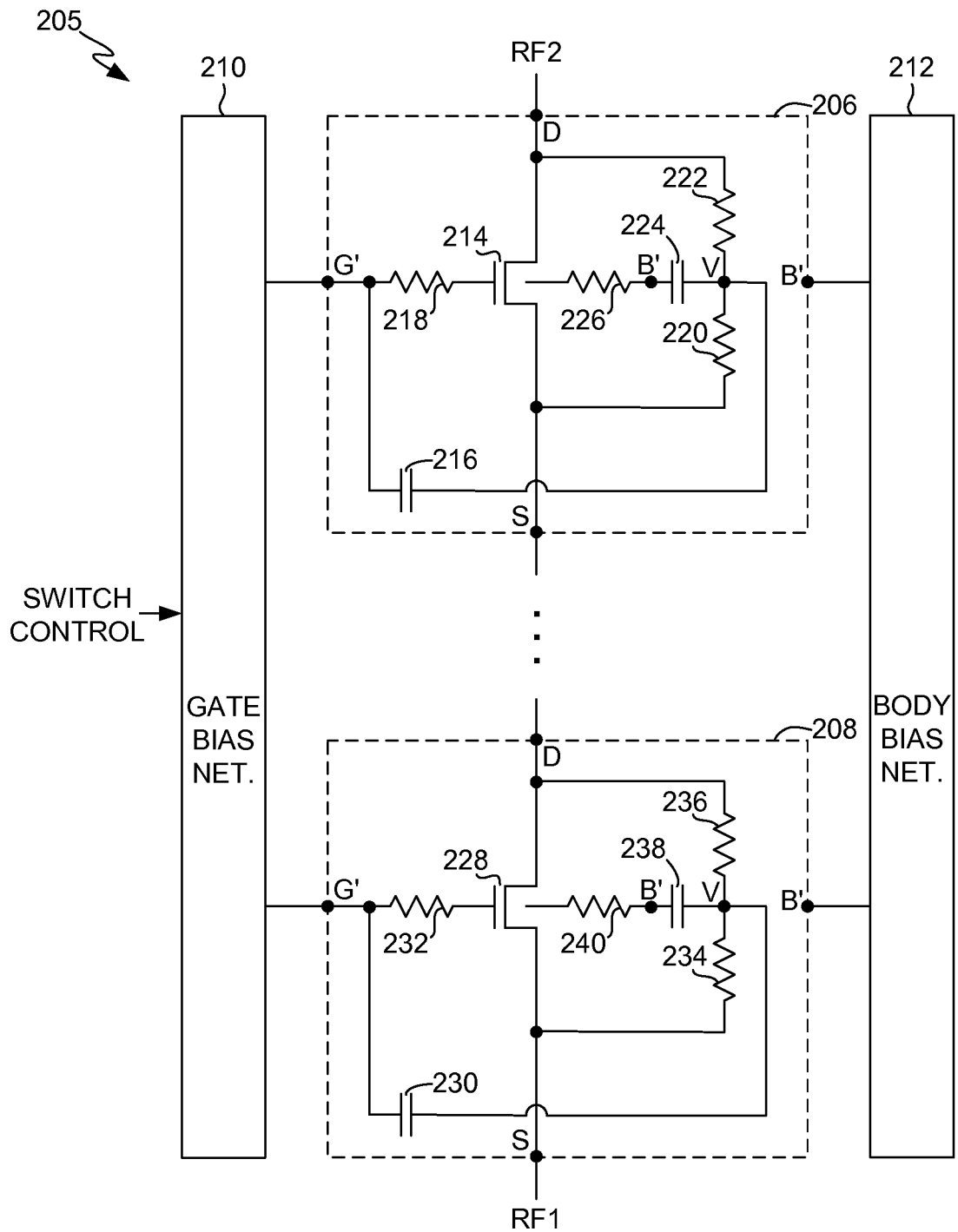
FIG. 9 is a circuit diagram illustrating a switch stack device having FET unit cell circuits with RC-based gate filters and RC-based body filters, in accordance with a seventh exemplary embodiment.

As illustrated in FIG. 9, in a seventh exemplary embodiment a switch stack device 205 includes a first FET unit cell circuit 206 through an Nth FET unit cell circuit 208, connected in a stack or chain topology in the same manner as described above with regard to other embodiments. Further FET unit cell circuits in the chain between first FET unit cell circuit 206 and Nth FET unit cell circuit 208 that are not shown for purposes of clarity are indicated by the ellipsis symbol ("..."). The number N of FET unit cell circuits 206-208 can be any number greater than one. Switch stack device 205 can be formed on an SOI substrate or in any other suitable manner.

In the exemplary embodiment illustrated in FIG. 9, the cell gate node of each of FET unit cell circuits 206-208 is connected to a gate bias network filter circuit 210 that biases the cell gate nodes as well as provides filtering in a manner described below with regard to FIGS. 18-22. However, in other embodiments (not shown) the cell gate nodes of such FET unit cell circuits can be connected to any other type of gate bias network, such as one that does not provide filtering. Gate bias network filter circuit 210 also receives a conventional switch control signal as an input, which can be used to operate switch stack device 206 in the manner described above with regard to other embodiments. Although not shown, gate bias network filter circuit 210 is connected to a source of one or more bias voltages.

The cell body node of each of FET unit cell circuits 206-208 is connected to a body bias network filter circuit 212 that biases the cell body nodes as well as provides filtering in a manner described below with regard to FIGS. 13-17. However, in other embodiments (not shown) the cell body nodes of such FET unit cell circuits can be connected to any other type of body bias network, such as one that does not provide filtering. Although not shown, body bias network filter circuit 212 is connected to a source of one or more bias voltages.

FET unit cell circuit 206 includes a FET 214, a gate filter, and a body filter. The gate filter includes a gate filter capacitance 216, a gate filter resistance 218, and a drain-source circuit. The drain-source circuit is connected between the drain and source nodes of FET 214 and comprises resistive divider circuit having a first resistance 220 in series with a second resistance 222. This drain-source circuit defines a virtual node V between first and second resistances 220 and 222. Gate filter capacitance 216 and gate filter resistance 218 are in series with each other and coupled between the gate node of FET 214 and the virtual node V. The body filter includes a body filter capacitance 224 and a body filter resistance 226 coupled between the body node of FET 214 and the virtual node V (and thus also coupled between the body node of FET 214 and the gate node of FET 214).

Note that the drain node of FET 214 defines a cell drain node of FET unit cell circuit 206, and the source node of FET 214 defines a cell source node of FET unit cell circuit 206. However, the cell gate node (G') of FET unit cell circuit 174 is defined not by the gate node of FET 214 but rather by another virtual (gate) node between gate filter capacitance 216 and gate filter resistance 218. Also, the cell body node (B') of FET unit cell circuit 206 is defined not by the body node of FET 214 but rather by a virtual (body) node B' between body filter resistance 226 and body filter capacitance 224.

The structure of FET unit cell circuit 206 promotes linear operation in a manner similar to that described above with regard to other embodiments. The combination of an RC-based gate filter and an RC-based body filter provides an effect that is similar to the above-described effect provided by the RC-based gate filters and RC-based body filters in other embodiments described above.

As each of the remaining N−1 FET unit cell circuits 208, etc., has a structure identical to that of above-described FET unit cell circuit 206, they are not described in similar detail. It can be noted that FET unit cell circuit 208 includes a FET 228, a gate filter capacitance 230, a gate filter resistance 232, a drain-source bias circuit comprising first and second resistances 234 and 236, a body filter capacitance 238, and a body filter resistance 240, which are identical to above-described FET 214, gate filter capacitance 216, gate filter resistance 218, first and second resistances 220 and 22, body filter capacitance 224, and body filter resistance 226, respectively.

Figure 10:
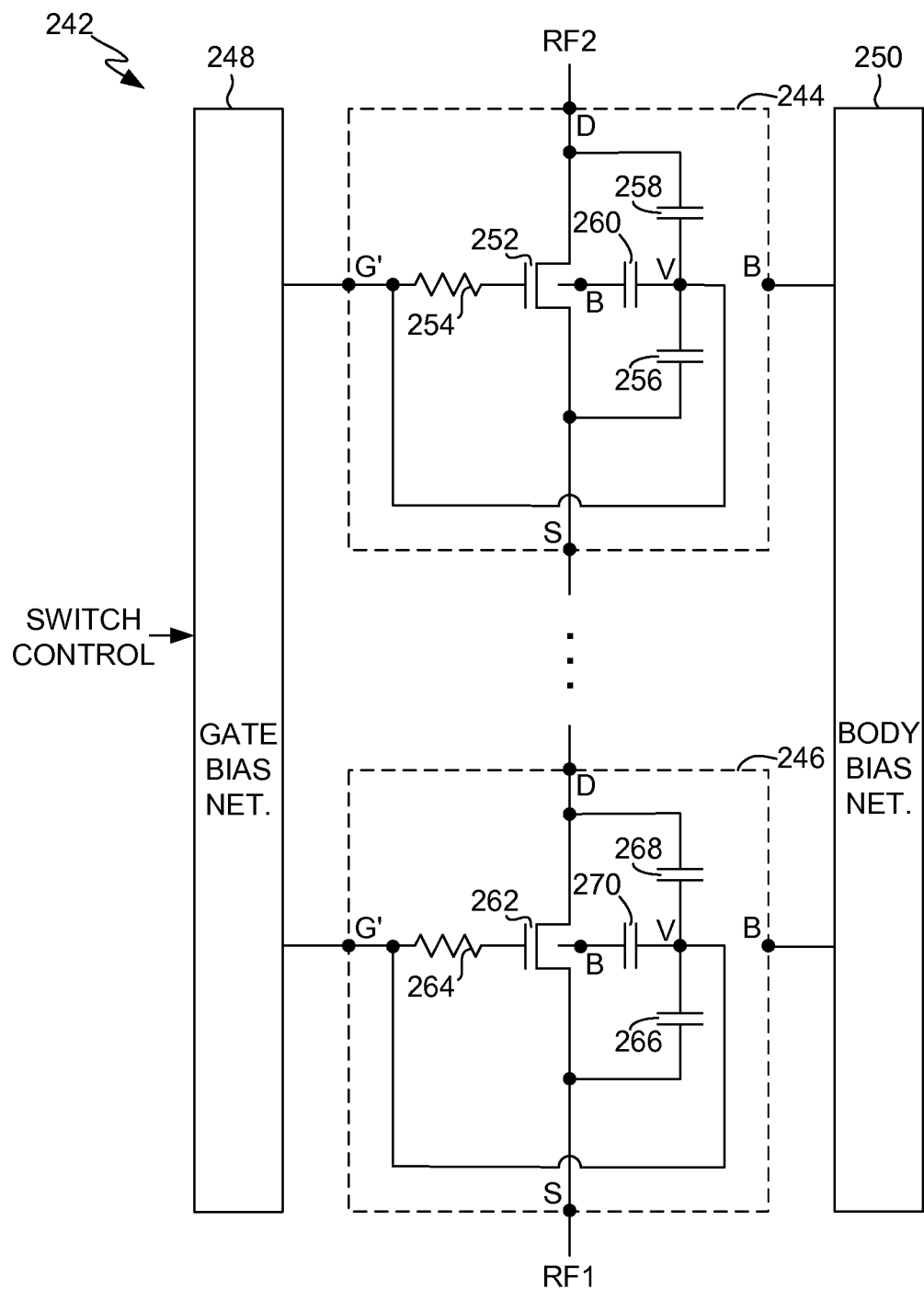
FIG. 10 is a circuit diagram illustrating a switch stack device having FET unit cell circuits with RC-based gate filters and C-based body filters, in accordance with a eighth exemplary embodiment.

As illustrated in FIG. 10, in an eighth exemplary embodiment a switch stack device 242 includes a first FET unit cell circuit 244 through an Nth FET unit cell circuit 246, connected in a stack or chain topology in the same manner as described above with regard to other embodiments. Further FET unit cell circuits in the chain between first FET unit cell circuit 244 and Nth FET unit cell circuit 246 that are not shown for purposes of clarity are indicated by the ellipsis symbol (" . . . "). The number N of FET unit cell circuits 244-246 can be any number greater than one. Switch stack device 242 can be formed on an SOI substrate or in any other suitable manner.

In the exemplary embodiment illustrated in FIG. 10, the cell gate node of each of FET unit cell circuits 244-246 is connected to a gate bias network filter circuit 248 that biases the cell gate nodes as well as provides filtering in a manner described below with regard to FIGS. 18-22. However, in other embodiments (not shown) the cell gate nodes of such FET unit cell circuits can be connected to any other type of gate bias network, such as one that does not provide filtering. Gate bias network filter circuit 248 also receives a conventional switch control signal as an input, which can be used to operate switch stack device 248 in the manner described above with regard to other embodiments. Although not shown, gate bias network filter circuit 248 is also connected to a source of one or more bias voltages.

The cell body node of each of FET unit cell circuits 244-246 is connected to a body bias network filter circuit 250 that biases the cell body nodes as well as provides filtering in a manner described below with regard to FIGS. 13-17. However, in other embodiments (not shown) the cell body nodes of such FET unit cell circuits can be connected to any other type of body bias network, such as one that does not provide filtering. Although not shown, body bias network filter circuit 250 is connected to a source of one or more bias voltages.

FET unit cell circuit 244 includes a FET 252, a gate filter, and a body filter. The gate filter includes a gate filter resistance 254 and a drain-source circuit. The drain-source circuit is connected between the drain and source nodes of FET 252 and comprises a capacitive divider circuit having a first capacitance 256 in series with a second capacitance 258. This drain-source circuit defines a virtual node V between first and second capacitances 256 and 258. Gate filter resistance 254 is coupled between the gate node of FET 252 and the virtual node V. The body filter includes a body filter capacitance 260 coupled between the body node of FET 252 and the virtual node V (and thus also coupled between the body node of FET 252 and the gate node of FET 252).

Note that the drain node of FET 252 defines a cell drain node of FET unit cell circuit 244, the source node of FET 252 defines a cell source node of FET unit cell circuit 244, and the body node of FET 252 defines a cell body node of FET unit cell circuit 244. (It should be understood that the body node of FET 252 and the cell body node of FET unit cell circuit 244 are the same node B, though a connection is not explicitly shown for purposes of clarity.) However, the cell gate node (G') of FET unit cell circuit 244 is defined not by the gate node of FET 252 but rather by another virtual (gate) node between gate filter resistance 254 and the virtual node V.

The structure of FET unit cell circuit 244 promotes linear operation in a manner similar to that described above with regard to other embodiments. The combination of an RC-based gate filter and a C-based body filter provides an effect that is similar to the above-described effect provided by the RC-based gate filters and C-based body filters in other embodiments described above.

As each of the remaining N−1 FET unit cell circuits 246, etc., has a structure identical to that of above-described FET unit cell circuit 244, they are not described in similar detail. It can be noted that FET unit cell circuit 246 includes a FET 262, a gate filter resistance 264, a drain-source circuit comprising first and second capacitances 266 and 268, and a body filter capacitance 270, which are identical to above-described FET 252, gate filter resistance 254, first and second capacitances 256 and 258, and body filter capacitance 260, respectively.

Figure 11:
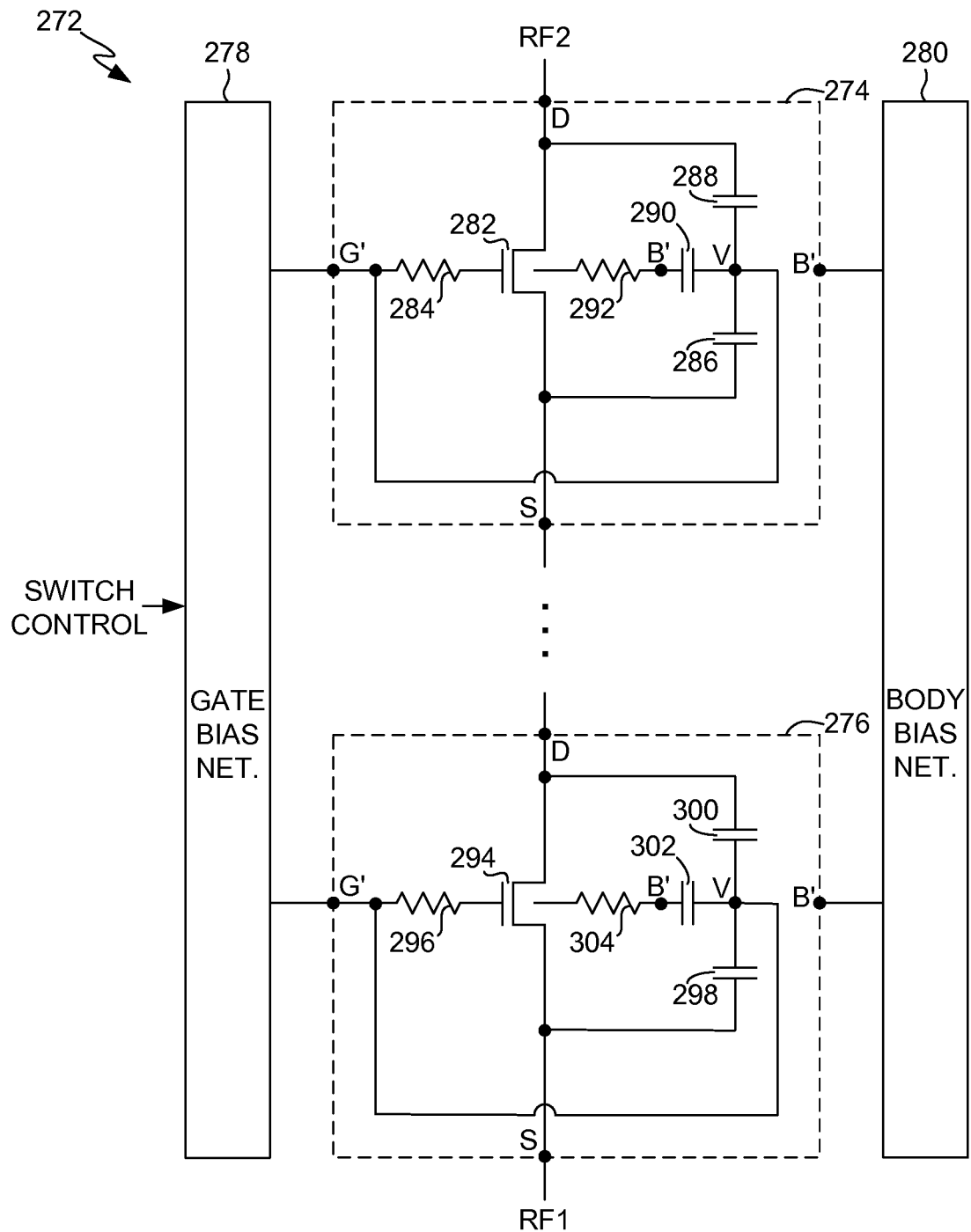
FIG. 11 is a circuit diagram illustrating a switch stack device having FET unit cell circuits with RC-based gate filters and RC-based body filters, in accordance with a ninth exemplary embodiment.

As illustrated in FIG. 11, in a ninth exemplary embodiment a switch stack device 272 includes a first FET unit cell circuit 274 through an Nth FET unit cell circuit 276, connected in a stack or chain topology in the same manner as described above with regard to other embodiments. Further FET unit cell circuits in the chain between first FET unit cell circuit 274 and Nth FET unit cell circuit 276 that are not shown for purposes of clarity are indicated by the ellipsis symbol (" . . . "). The number N of FET unit cell circuits 274-276 can be any number greater than one. Switch stack device 272 can be formed on an SOI substrate or in any other suitable manner.

In the exemplary embodiment illustrated in FIG. 11, the cell gate node of each of FET unit cell circuits 274-276 is connected to a gate bias network filter circuit 278 that biases the cell gate nodes as well as provides filtering in a manner described below with regard to FIGS. 18-22. However, in other embodiments (not shown) the cell gate nodes of such FET unit cell circuits can be connected to any other type of gate bias network, such as one that does not provide filtering. Gate bias network filter circuit 278 also receives a conventional switch control signal as an input, which can be used to operate switch stack device 272 in the manner described above with regard to other embodiments. Although not shown, gate bias network filter circuit 278 is also connected to a source of one or more bias voltages.

The cell body node of each of FET unit cell circuits 274-276 is connected to a body bias network filter circuit 280 that biases the cell body nodes as well as provides filtering in a manner described below with regard to FIGS. 13-17. However, in other embodiments (not shown) the cell body nodes of such FET unit cell circuits can be connected to any other type of body bias network, such as one that does not provide filtering. Although not shown, body bias network filter circuit 280 is connected to a source of one or more bias voltages.

FET unit cell circuit 274 includes a FET 282, a gate filter, and a body filter. The gate filter includes a gate filter resistance 284 and a drain-source circuit. The drain-source circuit is connected between the drain and source nodes of FET 282 and comprises a capacitive divider circuit having a first capacitance 286 in series with a second capacitance 288. This drain-source circuit defines a virtual node V between first and second capacitances 286 and 288. Gate filter resistance 284 is coupled between the gate node of FET 282 and the virtual node V. The body filter includes a body filter capacitance 290 and a body filter resistance 292 coupled between the body node of FET 282 and the virtual node V (and thus also coupled between the body node of FET 282 and the gate node of FET 282).

Note that the drain node of FET 282 defines a cell drain node of FET unit cell circuit 274, and the source node of FET 282 defines a cell source node of FET unit cell circuit 274. However, the cell gate node (G') of FET unit cell circuit 274 is defined not by the gate node of FET 282 but rather by another virtual (gate) node between gate filter resistance 284 and the virtual node V. Also, the cell body node (B') of FET unit cell circuit 274 is defined not by the body node of FET 282 but rather by a virtual (body) node B' between body filter resistance 292 and body filter capacitance 290.

The structure of FET unit cell circuit 274 promotes linear operation in a manner similar to that described above with regard to other embodiments. The combination of an RC-based gate filter and an RC-based body filter provides an effect that is similar to the above-described effect provided by the RC-based gate filters and RC-based body filters in other embodiments described above.

As each of the remaining N−1 FET unit cell circuits 276, etc., has a structure identical to that of above-described FET unit cell circuit 274, they are not described in similar detail. It can be noted that FET unit cell circuit 276 includes a FET 294, a gate filter resistance 296, a drain-source circuit comprising first and second capacitances 298 and 300, a body filter capacitance 302, and a body filter resistance 304, which are identical to above-described FET 282, gate filter resistance 284, first and second capacitances 286 and 288, body filter capacitance 290, and body filter resistance 292, respectively.

Figure 12:
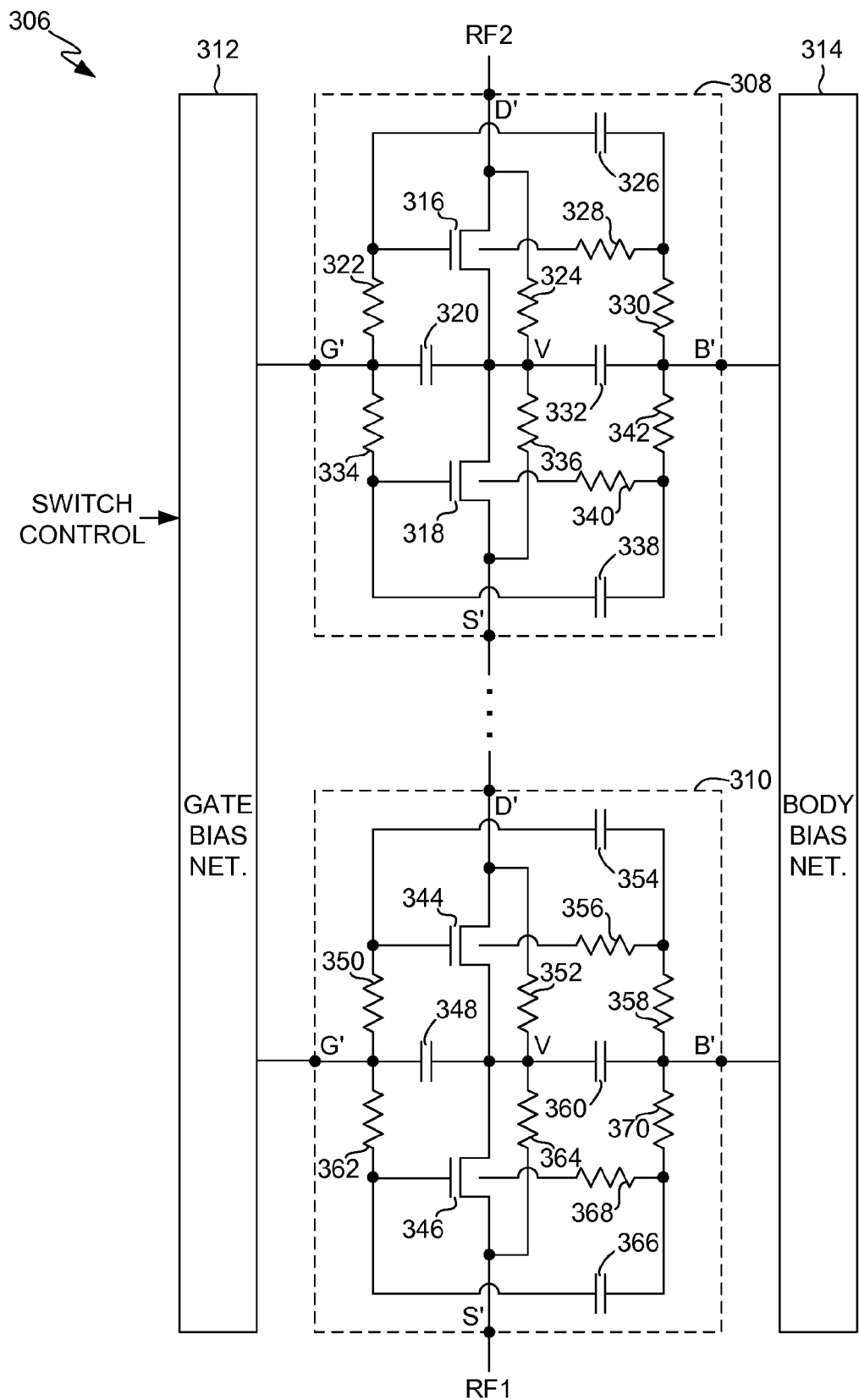
FIG. 12 is a circuit diagram illustrating a switch stack device having dual-FET unit cell circuits with RC-based gate filters and RC-based body filters, in accordance with a tenth exemplary embodiment.

As illustrated in FIG. 12, in a tenth exemplary embodiment a switch stack device 306 includes a first FET unit cell circuit 308 through an Nth FET unit cell circuit 310, connected in a stack or chain topology in the same manner as described above with regard to other embodiments. Further FET unit cell circuits in the chain between first FET unit cell circuit 308 and Nth FET unit cell circuit 310 that are not shown for purposes of clarity are indicated by the ellipsis symbol (" . . . "). The number N of FET unit cell circuits 308-310 can be any number greater than one. Switch stack device 306 can be formed on an SOI substrate or in any other suitable manner.

In the exemplary embodiment illustrated in FIG. 12, the cell gate node of each of FET unit cell circuits 308-310 is connected to a gate bias network filter circuit 312 that biases the cell gate nodes as well as provides filtering in a manner described below with regard to FIGS. 18-22. However, in other embodiments (not shown) the cell gate nodes of such FET unit cell circuits can be connected to any other type of gate bias network, such as one that does not provide filtering. Gate bias network filter circuit 312 also receives a conventional switch control signal as an input, which can be used to operate switch stack device 306 in the manner described above with regard to other embodiments. Although not shown, gate bias network filter circuit 312 is also connected to a source of one or more bias voltages.

The cell body node of each of FET unit cell circuits 308-310 is connected to a body bias network filter circuit 314 that biases the cell body nodes as well as provides filtering in a manner described below with regard to FIGS. 13-17. However, in other embodiments (not shown) the cell body nodes of such FET unit cell circuits can be connected to any other type of body bias network, such as one that does not provide filtering. Although not shown, body bias network filter circuit 314 is connected to a source of one or more bias voltages.

FET unit cell circuit 308 includes two FETs 316 and 318. In still other embodiments (not shown), a similar FET unit cell can include more than two FETs. In the dual-FET embodiment illustrated in FIG. 12, FET unit cell circuit 308 also includes a gate filter associated with FET 316, a gate-and-body filter associated with FET 316, and a body filter associated with FET 316, as well as a gate filter associated with FET 318, a gate-and-body filter associated with FET 318, and a body filter associated with FET 318.

The gate filter associated with FET 316 includes a gate filter capacitance 320 and a gate resistance 322. A drain-source circuit comprises a resistance 324 connected between the drain and source nodes of FET 316. The gate-and-body filter associated with FET 316 serves as both a gate filter and a body filter and includes a capacitance 326 and resistances 328 and 330. The body filter associated with FET 316 includes a shared capacitance 332 and resistances 328 and 330. A virtual node V is defined between capacitances 320 and 332 and the source node of FET 316.

The gate filter associated with FET 318 includes shared gate filter capacitance 320 and a gate resistance 334. A drain-source circuit comprises a resistance 336 connected between the drain and source nodes of FET 318. Note that the virtual node V is between resistances 324 and 336. The gate-and-body filter associated with FET 318 serves as both a gate filter and a body filter and includes a capacitance 338 and resistances 340 and 342. The body filter associated with FET 318 includes shared capacitance 332 and resistances 340 and 342.

Note that the drain node of FET 316 defines a cell drain node of FET unit cell circuit 308, and the source node of FET 318 defines a cell source node of FET unit cell circuit 308. The cell gate node (G') of FET unit cell circuit 308 is defined by a virtual (gate) node between resistances 322 and 334. The cell body node (B') of FET unit cell circuit 308 is defined by a virtual (body) node between resistances 330 and 342.

The structure of FET unit cell circuit 308 promotes linear operation in a manner similar to that described above with regard to other embodiments. The combination of two RC-based gate filters and, in effect, three RC-based body filters provides an effect that is similar to the above-described effect provided by the RC-based gate filters and RC-based body filters in other embodiments described above.

As each of the remaining N−1 FET unit cell circuits 310, etc., has a structure identical to that of above-described FET unit cell circuit 308, they are not described in similar detail. It can be noted that FET unit cell circuit 310 includes two FETs 344 and 346, gate resistances 350 and 362, drain-source bias resistances 352 and 364, gate-and-body filter capacitances 354 and 366, and body resistances 356, 358, 368 and 370, which are identical to above-described FETs 316 and 318, gate resistances 322 and 334, drain-source bias resistances 324 and 336, gate-and-body filter capacitances 326 and 338, and body resistances 328, 330, 340 and 342, respectively.

Figure 13:
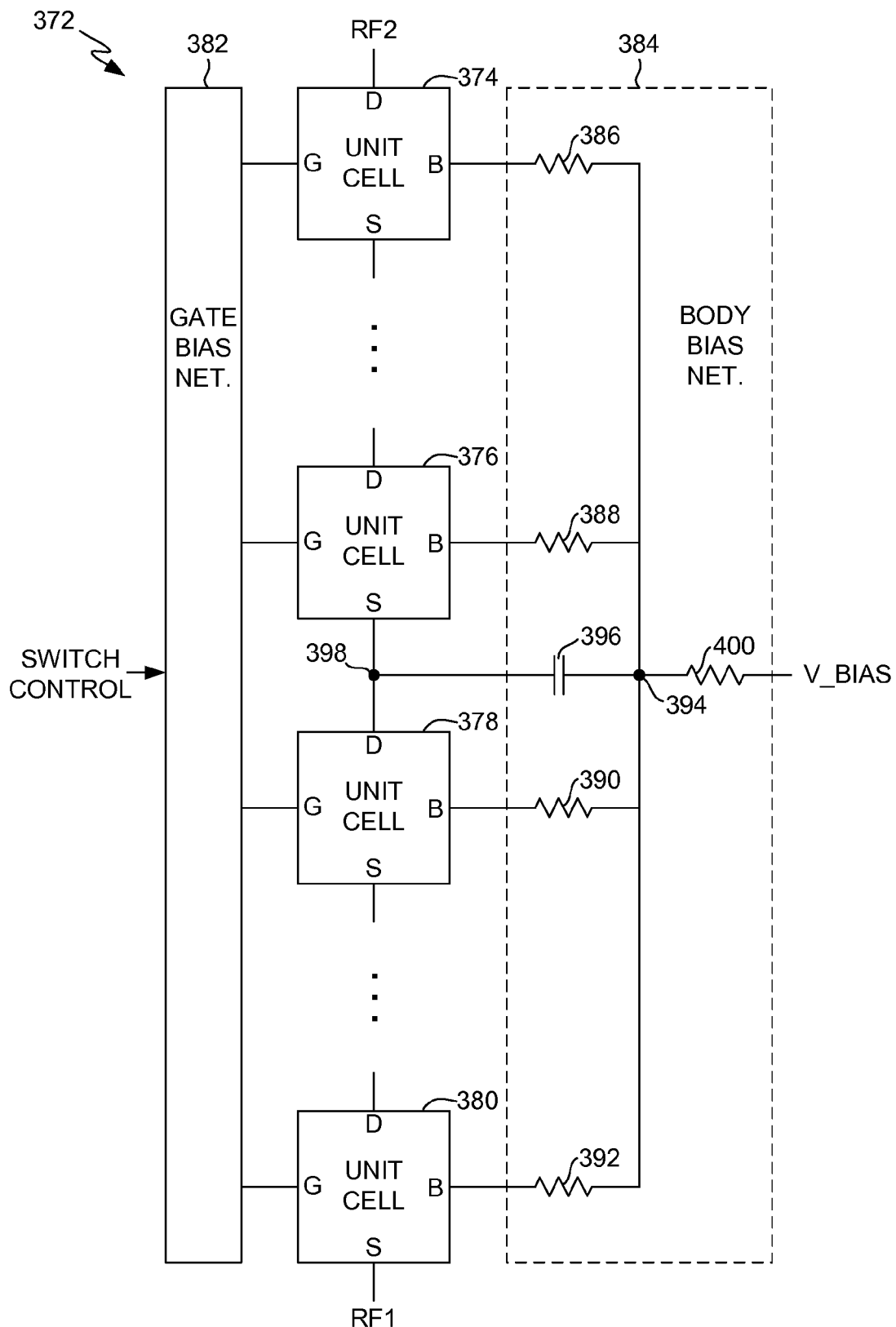
FIG. 13 is a circuit diagram illustrating a switch stack device having an even number of FET unit cell circuits and a C-based body bias network filter circuit and having parallel body bias resistances, in accordance with an eleventh exemplary embodiment.

As illustrated in FIG. 13, in an eleventh exemplary embodiment a switch stack device 372 includes a first FET unit cell circuit 374 through an Nth FET unit cell circuit 380, connected in a stack or chain topology in the same manner as described above with regard to other embodiments. In the embodiment illustrated in FIG. 13, the total number N of FET unit cell circuits 374-380 is even. Thus, half (or N/2) of the total number N of FET unit cell circuit 374-380 consist of first FET unit cell circuit 374 through an (N/2)th FET unit cell circuit 376, and the other half (or N/2) of the total number N of FET unit cell circuits 374-380 consist of an ((N/2)+1)th FET unit cell circuit 378 through Nth FET unit cell circuit 380. Stated another way, (N/2)th FET unit cell circuit 376 and (N/2)+1)th FET unit cell circuit 378 are a pair of successive FET unit cell circuits located in the middle of the chain. Further FET unit cell circuits in the chain between first FET unit cell circuit 374 and (N/2)th FET unit cell circuit 376 and between ((N/2)+1)th FET unit cell circuit 378 and Nth FET unit cell circuit 380 that are not shown for purposes of clarity are indicated by the ellipsis symbol (" . . . "). The number N of FET unit cell circuits 374-380 can be any even number greater than one. Switch stack device 372 can be formed on an SOI substrate or in any other suitable manner.

FET unit cell circuits 374-380 can be of any of the various types described above with regard to the embodiments illustrated in FIGS. 3-12. Alternatively, FET unit cell circuits 374-380 can be of a conventional type.

The cell gate node of each of FET unit cell circuits 374-380 is connected to a gate bias network filter circuit 382 that biases the cell gate nodes as well as provides filtering in a manner described below with regard to FIGS. 18-22. However, in other embodiments (not shown) the cell gate nodes of such FET unit cell circuits can be connected to any other type of gate bias network, such as one that does not provide filtering. Gate bias network filter circuit 382 also receives a conventional switch control signal as an input, which can be used to operate switch stack device 372 in the manner described above with regard to other embodiments. Although not shown, gate bias network filter circuit 382 is also connected to a source of one or more bias voltages.

The cell body node of each of FET unit cell circuits 374-380 is connected to a body bias network filter circuit 384 that biases the cell body nodes as well as provides filtering in the following manner. Body bias network filter circuit 384 includes N body bias network resistances 386-392 in parallel with each other with respect to a common node 394. That is, each of body bias network resistances 386-392 is connected to common node 394. Each of body bias network resistances 386-392 corresponds to one of FET unit cell circuits 374-380 and is connected to the cell body node of that corresponding one of FET unit cell circuits 374-380. Thus, each of body bias network resistances 386-392 is connected between the cell body node of its corresponding one of FET unit cell circuits 374-380 and common node 394.

A body bias network filter capacitance 396 is connected to a mid-node 398 defined by the drain-source connection between (N/2)th FET unit cell circuit 376 and ((N/2)+1)th FET unit cell circuit 378. Body bias network filter capacitance 396 is connected between mid-node 398 and common node 394. Thus, body bias network filter capacitance 396 is coupled between mid-node 398 and the cell body node of each of FET unit cell circuits 374-380 via common node 394. Common node 394 is coupled to a body bias voltage ("V_BIAS") node via a common resistance 400.

Body bias network filter capacitance 396 defines a C-based filter that filters the cell body node voltage of each of FET unit cell circuits 374-380. Thus, this C-based body bias network filter circuit 384 promotes linear operation of switch stack device 372.

Figure 14:
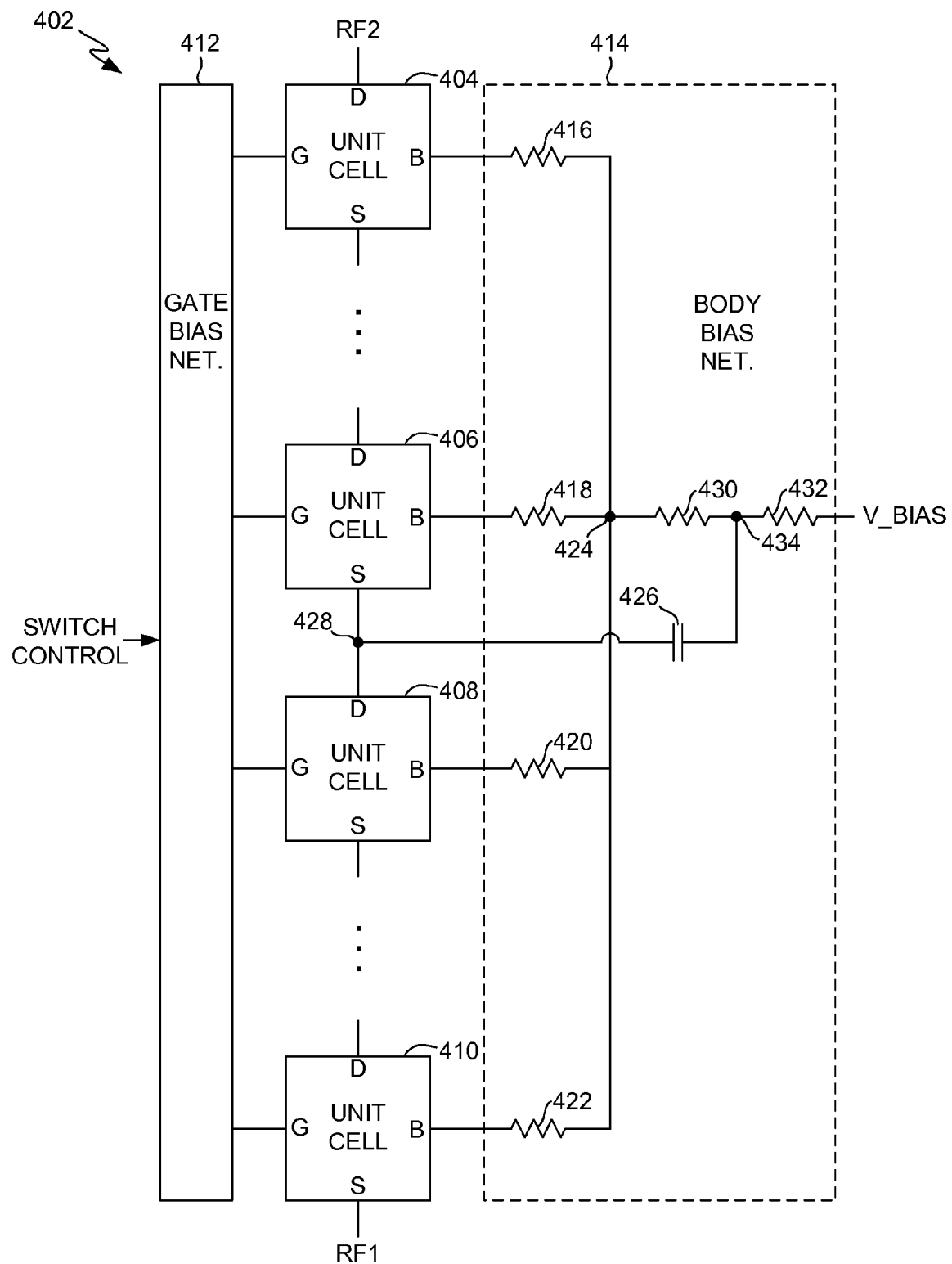
FIG. 14 is a circuit diagram illustrating a switch stack device having an even number of FET unit cell circuits and an RC-based body bias network filter circuit and having parallel body bias resistances, in accordance with an twelfth exemplary embodiment.

As illustrated in FIG. 14, in a twelfth exemplary embodiment a switch stack device 402 includes a first FET unit cell circuit 404 through an Nth FET unit cell circuit 410, connected in a stack or chain topology in the same manner as described above with regard to other embodiments. In the embodiment illustrated in FIG. 14, the total number N of FET unit cell circuits 404-410 is even. Thus, half (or N/2) of the total number N of FET unit cell circuit 404-410 consist of first FET unit cell circuit 404 through an (N/2)th FET unit cell circuit 406, and the other half (or N/2) of the total number N of FET unit cell circuits 404-410 consist of an ((N/2)+1)th FET unit cell circuit 408 through Nth FET unit cell circuit 410. Stated another way, (N/2)th FET unit cell circuit 406 and ((N/2)+1)th FET unit cell circuit 408 are a pair of successive FET unit cell circuits located in the middle of the chain. Further FET unit cell circuits in the chain between first FET unit cell circuit 404 and (N/2)th FET unit cell circuit 406 and between ((N/2)+1)th FET unit cell circuit 408 and Nth FET unit cell circuit 410 that are not shown for purposes of clarity are indicated by the ellipsis symbol (" . . . "). The number N of FET unit cell circuits 404-410 can be any even number greater than one.

FET unit cell circuits 404-410 can be of any of the various types described above with regard to the embodiments illustrated in FIGS. 3-12. Alternatively, FET unit cell circuits 404-410 can be of a conventional type. Switch stack device 402 can be formed on an SOI substrate or in any other suitable manner.

The cell gate node of each of FET unit cell circuits 404-410 is connected to a gate bias network filter circuit 412 that biases the cell gate nodes as well as provides filtering in a manner described below with regard to FIGS. 18-22. However, in other embodiments (not shown) the cell gate nodes of such FET unit cell circuits can be connected to any other type of gate bias network, such as one that does not provide filtering. Gate bias network filter circuit 412 also receives a conventional switch control signal as an input, which can be used to operate switch stack device 402 in the manner described above with regard to other embodiments. Although not shown, gate bias network filter circuit 412 is also connected to a source of one or more bias voltages.

The cell body node of each of FET unit cell circuits 404-410 is connected to a body bias network filter circuit 414 that biases the cell body nodes as well as provides filtering in the following manner. Body bias network filter circuit 414 includes N body bias network resistances 416-422 in parallel with each other with respect to a common node 424. That is, each of body bias network resistances 416-422 is connected to common node 424. Each of body bias network filter resistances 416-422 corresponds to one of FET unit cell circuits 404-410 and is connected to the cell body node of that corresponding one of FET unit cell circuits 404-410. Thus, each of body bias network resistances 416-422 is connected between the cell body node of its corresponding one of FET unit cell circuits 404-410 and common node 424.

Body bias network filter circuit 414 also includes a body bias network filter capacitance 426 and a body bias network filter common resistance 430. Body bias network filter capacitance 426 is connected to a mid-node 428 defined by the drain-source connection between (N/2)th FET unit cell circuit 406 and ((N/2)+1)th FET unit cell circuit 408. Body bias network filter capacitance 426 is coupled to common node 424 via body bias network filter common resistance 430. Thus, body bias network filter capacitance 426 and body bias network filter common resistance 430 are in series with each other and coupled between mid-node 428 and the cell body node of each of FET unit cell circuits 404-410 via common node 424. A common resistance 432 couples a body bias voltage ("V_BIAS") node to a node 434 between body bias network filter capacitance 426 and body bias network filter common resistance 430. Thus, common node 424 is coupled to the V_BIAS node via resistances 430 and 432.

Body bias network filter capacitance 426 and body bias network filter common resistance 430 together define an RC-based filter that filters the cell body node voltage of each of FET unit cell circuits 404-410. This RC-based body bias network filter circuit 414 thus promotes linear operation of switch stack device 402.

Figure 15:
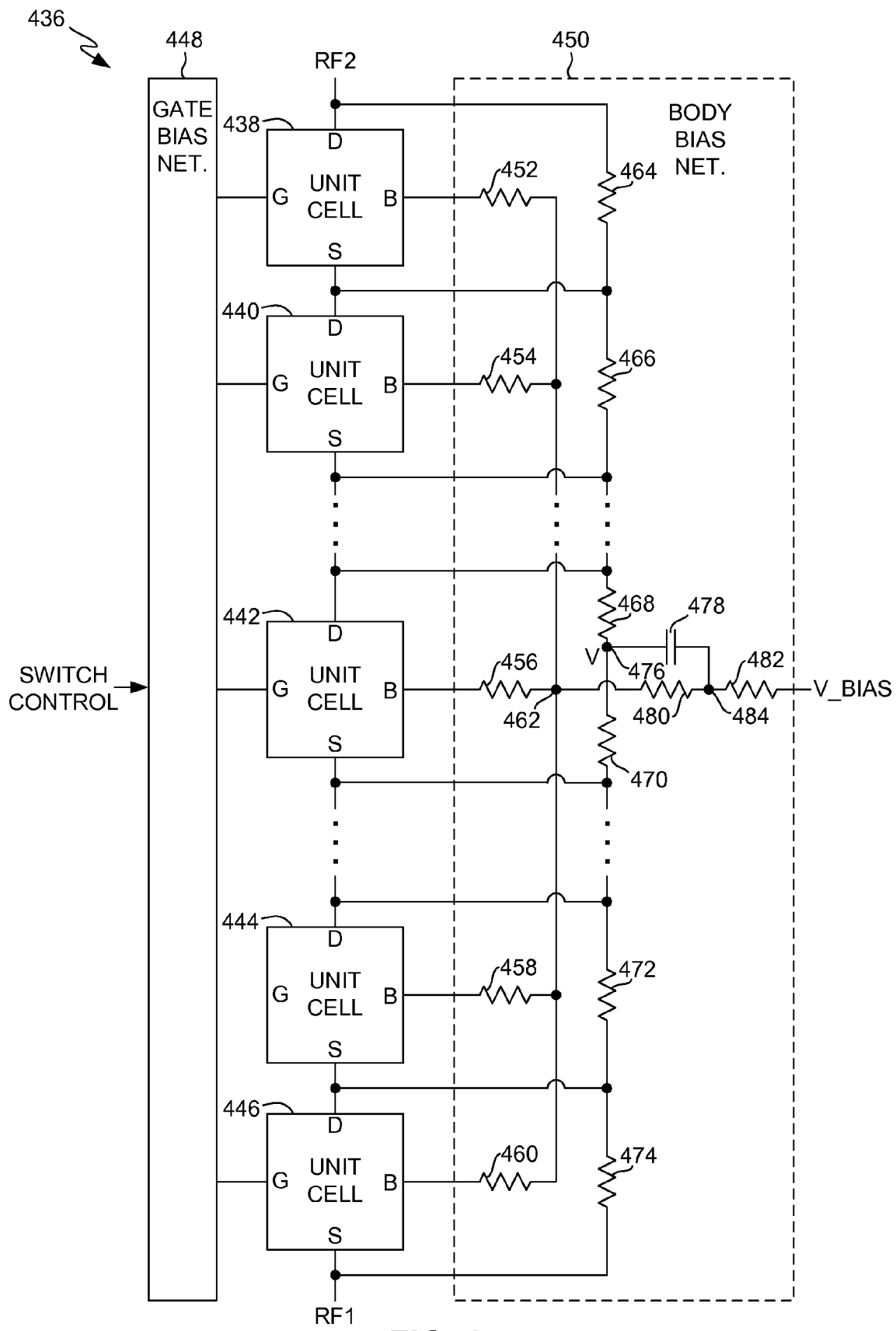
FIG. 15 is a circuit diagram illustrating a switch stack device having an odd number of FET unit cell circuits and an RC-based body bias network filter circuit and having parallel body bias resistances, in accordance with a thirteenth exemplary embodiment.

As illustrated in FIG. 15, in a thirteenth exemplary embodiment a switch stack device 436 includes a first FET unit cell circuit 438 through an Nth FET unit cell circuit 446, connected in a stack or chain topology in the same manner as described above with regard to other embodiments. Thus, the chain begins with the cell source node of first FET unit cell circuit 438 connected to the cell drain node of second FET unit cell circuit 440, and continues through the cell source node of the (N−1)th FET unit cell circuit 444 connected to the cell drain node of Nth FET unit cell circuit 446. In the embodiment illustrated in FIG. 15, the total number N of FET unit cell circuits 438-446 is odd. Thus, an ((N+1)/2)th FET unit cell circuit 442 is located in the middle of the chain. Further FET unit cell circuits in the chain between second FET unit cell circuit 440 and ((N+1)/2)th FET unit cell circuit 442 and between ((N+1)/2)th FET unit cell circuit 442 and (N−1)th FET unit cell circuit 444 that are not shown for purposes of clarity are indicated by the ellipsis symbol (" . . . "). The number N of FET unit cell circuits 438-446 can be any odd number greater than one. Switch stack device 436 can be formed on an SOI substrate or in any other suitable manner.

FET unit cell circuits 438-446 can be of any of the various types described above with regard to the embodiments illustrated in FIGS. 3-12. Alternatively, FET unit cell circuits 438-446 can be of a conventional type.

The cell gate node of each of FET unit cell circuits 438-446 is connected to a gate bias network filter circuit 448 that biases the cell gate nodes as well as provides filtering in a manner described below with regard to FIGS. 18-22. However, in other embodiments (not shown) the cell gate nodes of such FET unit cell circuits can be connected to any other type of gate bias network, such as one that does not provide filtering. Gate bias network filter circuit 448 also receives a conventional switch control signal as an input, which can be used to operate switch stack device 436 in the manner described above with regard to other embodiments. Although not shown, gate bias network filter circuit 448 is also connected to a source of one or more bias voltages.

The cell body node of each of FET unit cell circuits 438-446 is connected to a body bias network filter circuit 450 that biases the cell body nodes as well as provides filtering in the following manner. Body bias network filter circuit 450 includes N body bias network resistances 452-460 in parallel with each other with respect to a common node 462. That is, each of body bias network resistances 452-460 is connected to common node 462. Each of body bias network resistances 452-460 corresponds to one of FET unit cell circuits 438-446 and is connected to the cell body node of that corresponding one of FET unit cell circuits 438-446. Thus: first body bias network resistance 452 is connected to the cell body node of first FET unit cell circuit 438; second body bias network resistance 454 is connected to the cell body node of second FET unit cell circuit 440; and so on, through an ((N+1)/2)th body bias network resistance 456, which is connected to the cell body node of ((N+1)/2)th FET unit cell circuit 442; and so on, through (N−1)th body bias resistance 458, which is connected to the cell body node of FET unit cell circuit 444; and finally Nth body bias network resistance 460, which is connected to the cell body node of Nth FET unit cell circuit 446. Each of body bias network resistances 452-460 is connected between the cell body node of its corresponding one of FET unit cell circuits 438-446 and common node 462.

Body bias network filter circuit 450 also includes N+1 drain-source resistances 464-474 connected in series with each other. Each of drain-source resistances 464-474 corresponds to one of FET unit cell circuits 438-446 and is connected between the cell drain node and cell source node of its corresponding one of FET unit cell circuits 438-446. Thus: the first drain-source resistance 464 is connected between the cell drain node and cell source node of FET unit cell circuit 438; a second drain-source resistance 466 is connected between the cell drain node and cell source node of second FET unit cell circuit 440; and so on, through an Nth drain-source resistance 472, which is connected between the cell drain node and cell source node of (N−1)th FET unit cell circuit 444; and finally an (N+1)th drain-source resistance 474, which is connected between the cell drain node and cell source node of Nth FET unit cell circuit 446. In this embodiment, a mid-node 476 (i.e., a virtual node V) is defined between an ((N+1)/2)th drain-source resistance 468 and an ((N+1)/2+1)th drain-source resistance 470. The ((N+1)/2)th drain-source resistance 468 and an ((N+1)/2+1)th drain-source resistance 470 are in series with each other and connected between the cell drain node and cell source node of ((N+1)/2)th FET unit cell circuit 442 in the middle of the chain. The ((N+1)/2)th drain-source resistance 468 and an ((N+1)/2+1)th drain-source resistance 470 both correspond to ((N+1)/2)th FET unit cell circuit 442. Stated another way, except for the cell drain and source nodes of ((N+1)/2)th FET unit cell circuit 442, which are connected by drain-source resistances 468 and 470 in series, only a single drain-source resistance is connected between the cell drain and source nodes of each corresponding FET unit cell circuit. It can be noted that mid-node 476 is also located between the cell drain node and cell source node of ((N+1)/2)th FET unit cell circuit 442. It can also be noted that mid-node 476 is located between a first series-connected group of (N+1)/2 of drain-source resistances 464-468 and a second series-connected group of (N+1)/2 of drain-source resistances 470-474.

Body bias network filter circuit 450 also includes a body bias network filter capacitance 478 and a body bias network filter common resistance 480. Body bias network filter capacitance 478 is connected to mid-node 476 and coupled to common node 462 via body bias network filter common resistance 480. Thus, body bias network filter capacitance 478 and body bias network filter common resistance 480 are in series with each other and coupled between mid-node 476 and the cell body node of each of FET unit cell circuits 438-446 via common node 476. A common resistance 482 couples a body bias voltage ("V_BIAS") node to a node 484 between body bias network filter capacitance 478 and body bias network filter common resistance 480. Thus, common node 462 is coupled to the V_BIAS node via resistances 480 and 482.

Body bias network filter capacitance 478 and body bias network filter common resistance 480 together define an RC-based filter that filters the cell body node voltage of each of FET unit cell circuits 438-446. This RC-based body bias network filter circuit 450 thus promotes linear operation of switch stack device 436.

Figure 16:
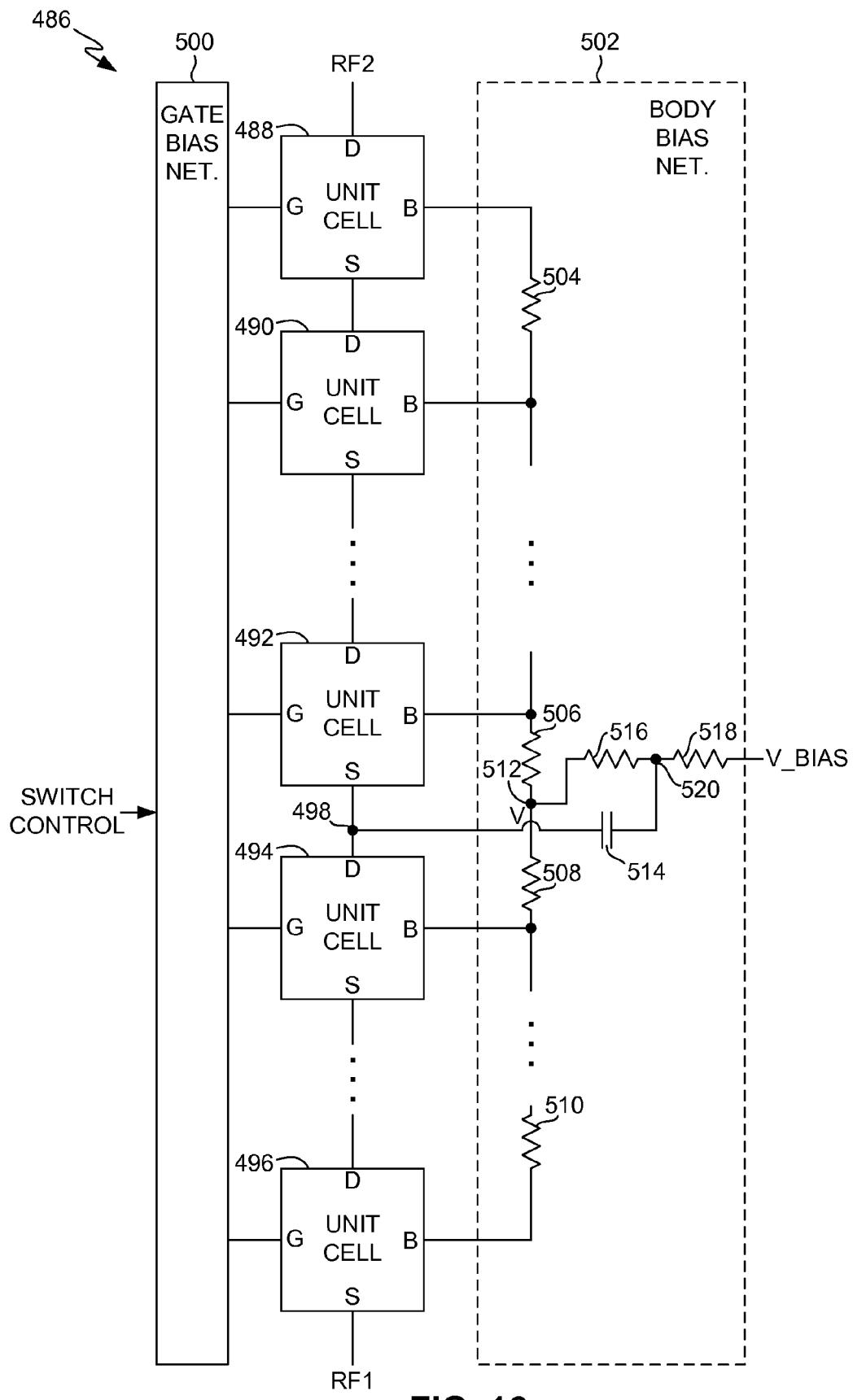
FIG. 16 is a circuit diagram illustrating a switch stack device having an even number of FET unit cell circuits and an RC-based body bias network filter circuit and having series body bias resistances, in accordance with a fourteenth exemplary embodiment.

As illustrated in FIG. 16, in a fourteenth exemplary embodiment a switch stack device 486 includes a first FET unit cell circuit 488 through an Nth FET unit cell circuit 496, connected in a stack or chain topology in the same manner as described above with regard to other embodiments. In the embodiment illustrated in FIG. 16, the total number N of FET unit cell circuits 488-496 is even. Thus, half (or N/2) of the total number N of FET unit cell circuits 488-496 consist of first FET unit cell circuit 488, a second FET unit cell circuit 490, etc., through an (N/2)th FET unit cell circuit 492, and the other half (or N/2) of the total number N of FET unit cell circuits 488-496 consist of an ((N/2)+1)th FET unit cell circuit 494 through Nth FET unit cell circuit 496. Stated another way, (N/2)th FET unit cell circuit 492 and ((N/2)+1)th FET unit cell circuit 494 are a pair of successive FET unit cell circuits located in the middle of the chain. A mid-node 498 is defined by the drain-source connection between the cell source node of (N/2)th FET unit cell circuit 492 and the cell drain node of ((N/2)+1)th FET unit cell circuit 494. Further FET unit cell circuits in the chain between second FET unit cell circuit 490 and (N/2)th FET unit cell circuit 492 and between ((N/2)+1)th FET unit cell circuit 494 and Nth FET unit cell circuit 496 that are not shown for purposes of clarity are indicated by the ellipsis symbol (" . . . "). The number N of FET unit cell circuits 488-496 can be any even number greater than one. Switch stack device 486 can be formed on an SOI substrate or in any other suitable manner.

FET unit cell circuits 488-496 can be of any of the various types described above with regard to the embodiments illustrated in FIGS. 3-12. Alternatively, FET unit cell circuits 488-496 can be of a conventional type.

The cell gate node of each of FET unit cell circuits 488-496 is connected to a gate bias network filter circuit 500 that biases the cell gate nodes as well as provides filtering in a manner described below with regard to FIGS. 18-22. However, in other embodiments (not shown) the cell gate nodes of such FET unit cell circuits can be connected to any other type of gate bias network, such as one that does not provide filtering. Gate bias network filter circuit 500 also receives a conventional switch control signal as an input, which can be used to operate switch stack device 486 in the manner described above with regard to other embodiments. Although not shown, gate bias network filter circuit 486 is also connected to a source of one or more bias voltages.

The cell body node of each of FET unit cell circuits 488-496 is connected to a body bias network filter circuit 502 that biases the cell body nodes as well as provides filtering in the following manner. Body bias network filter circuit 502 includes N body bias network resistances 504-510 in series with each other. Each of body bias network resistances 504-510 is coupled between the body nodes of a pair of successive FET unit cell circuits in the chain. For example, the first body bias network resistance 504 is connected between the cell body node of first FET unit cell circuit 488 and the cell body node of second FET unit cell circuit 490. In this embodiment, a common node 512 (i.e., a virtual node V) is defined between an (N/2)th body bias network resistance 506 and an ((N/2)+1)th body bias network resistance 508. The (N/2)th body bias network resistance 506 and ((N/2)+1)th body bias network resistance 508 are in series with each other and connected between the cell body node of (N/2)th FET unit cell circuit 492 and the cell body node of ((N/2)+1)th FET unit cell circuit 494. Except for the successive FET unit circuit cell pair consisting of (N/2)th FET unit cell circuit 492 and ((N/2)+1)th FET unit cell circuit 494, which are connected by body bias network resistances 506 and 508 in series, only a single body bias network resistance is connected between each successive FET unit cell circuit pair. It can be noted that common node 512 is located between the a first series-connected group of N/2 of body bias network resistances 504-506 and a second series-connected group of N/2 of body bias network resistances 508-510.

Body bias network filter circuit 502 also includes a body bias network filter capacitance 514 and a body bias network common resistance 516. Body bias network filter capacitance 514 is coupled between mid-node 498 and common node 512 via body bias network filter common resistance 516. Thus, body bias network filter capacitance 514 and body bias network common resistance 516 are in series with each other and coupled between mid-node 498 and the cell body node of each of FET unit cell circuits 488-496 via common node 512. A common resistance 518 couples a body bias voltage ("V_BIAS") node to a node 520 between body bias network filter capacitance 514 and body bias network common resistance 516. Thus, common node 512 is coupled to the V_BIAS node via resistances 516 and 518.

Body bias network filter capacitance 514 and body bias network common resistance 516 together define an RC-based filter that filters the cell body node voltage of each of FET unit cell circuits 488-496. This RC-based body bias network filter circuit 502 thus promotes linear operation of switch stack device 486.

Figure 17:
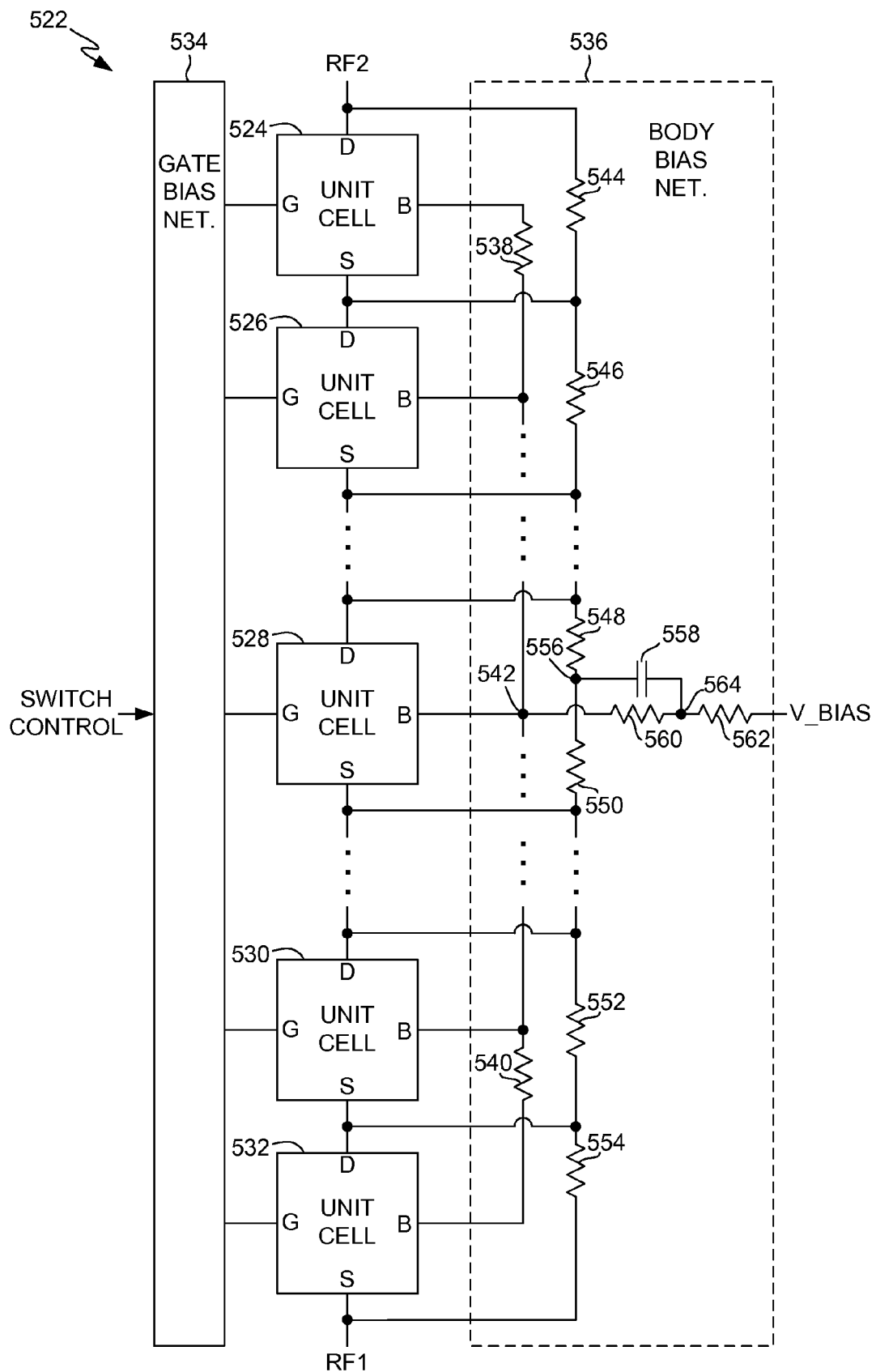
FIG. 17 is a circuit diagram illustrating a switch stack device having an odd number of FET unit cell circuits and an RC-based body bias network filter circuit and having series body bias resistances, in accordance with a fifteenth exemplary embodiment.

As illustrated in FIG. 17, in a fifteenth exemplary embodiment a switch stack device 522 includes a first FET unit cell circuit 524 through an Nth FET unit cell circuit 532, connected in a stack or chain topology in the same manner as described above with regard to other embodiments. Thus, the chain begins with the cell source node of first FET unit cell circuit 524 connected to the cell drain node of second FET unit cell circuit 526, and continues through the cell source node of the (N−1)th FET unit cell circuit 530 connected to the cell drain node of Nth FET unit cell circuit 532. In the embodiment illustrated in FIG. 17, the total number N of FET unit cell circuits 524-532 is odd. Thus, an ((N+1)/2)th FET unit cell circuit 528 is located in the middle of the chain. Further FET unit cell circuits in the chain between second FET unit cell circuit 526 and ((N+1)/2)th FET unit cell circuit 528 and between ((N+1)/2)th FET unit cell circuit 528 and (N−1)th FET unit cell circuit 530 that are not shown for purposes of clarity are indicated by the ellipsis symbol (" . . . "). The number N of FET unit cell circuits 524-532 can be any odd number greater than one. Switch stack device 522 can be formed on an SOI substrate or in any other suitable manner.

FET unit cell circuits 524-532 can be of any of the various types described above with regard to the embodiments illustrated in FIGS. 3-12. Alternatively, FET unit cell circuits 524-532 can be of a conventional type.

The cell gate node of each of FET unit cell circuits 524-532 is connected to a gate bias network filter circuit 534 that biases the cell gate nodes as well as provides filtering in a manner described below with regard to FIGS. 18-22.

However, in other embodiments (not shown) the cell gate nodes of such FET unit cell circuits can be connected to any other type of gate bias network, such as one that does not provide filtering. Gate bias network filter circuit 534 also receives a conventional switch control signal as an input, which can be used to operate switch stack device 522 in the manner described above with regard to other embodiments. Although not shown, gate bias network filter circuit 534 is also connected to a source of one or more bias voltages.

The cell body node of each of FET unit cell circuits 524-532 is connected to a body bias network filter circuit 536 that biases the cell body nodes as well as provides filtering in the following manner. Body bias network filter circuit 536 includes N body bias network resistances 538-540 in series with each other. Each of body bias network resistances 538-540 is coupled between the body nodes of a pair of successive FET unit cell circuits in the chain. For example, the first body bias network resistance 538 is connected between the cell body node of first FET unit cell circuit 524 and the cell body node of second FET unit cell circuit 526, and an Nth body bias network resistance 540 is connected between the cell body node of (N−1)th FET unit cell circuit 530 and the cell body node of Nth FET unit cell circuit 532. In this embodiment, a common node 542 is defined by the cell body node of ((N+1)/2)th FET unit cell circuit 528 in the middle of the chain. Common node 542 is thus located between a first series-connected group of (N−1)/2 of body bias network resistances and a second series-connected group of (N−1)/2 of body bias network resistances.

Body bias network filter circuit 536 also includes N+1 drain-source resistances 544-554 connected in series with each other. Each of drain-source resistances 544-554 corresponds to one of FET unit cell circuits 524-532 and is connected between the cell drain node and cell source node of its corresponding one of FET unit cell circuits 524-532. Thus, for example, the first drain-source resistance 544 is connected between the cell drain node and cell source node of FET unit cell circuit 524, a second drain-source resistance 546 is connected between the cell drain node and cell source node of second FET unit cell circuit 526, etc., through an Nth drain-source resistance 552, which is connected between the cell drain node and cell source node of (N−1)th FET unit cell circuit 530, and finally an (N+1)th drain-source resistance 554, which is connected between the cell drain node and cell source node of Nth FET unit cell circuit 532. In this embodiment, a mid-node 556 (i.e., a virtual node V) is defined between an ((N+1)/2)th drain-source resistance 548 and an ((N+1)/2)+1)th drain-source resistance 550. The ((N+1)/2)th drain-source resistance 548 and ((N+1)/2)+1)th drain-source resistance 550 are in series with each other and connected between the cell drain node and cell source node of ((N+1)/2)th FET unit cell circuit 528 in the middle of the chain. The (N/2)th drain-source resistance 548 and ((N+1)/2)+1)th drain-source resistance 550 both correspond to ((N+1)/2)th FET unit cell circuit 528. Stated another way, except for the cell drain and source nodes of FET unit cell circuit 528, which are connected by drain-source resistances 548 and 550 in series, only a single drain-source resistance is connected between the cell drain and source nodes of each corresponding FET unit cell circuit. It can be noted that mid-node 556 is also located between the cell drain node and cell source node of ((N+1)/2)th FET unit cell circuit 528. It can also be noted that mid-node 556 is located between a first series-connected group of (N+1)/2 of drain-source resistances 544-548 and a second series-connected group of (N+1)/2 of drain-source resistances 550-554.

Body bias network filter circuit 536 also includes a body bias network filter capacitance 558 and a body bias network common resistance 560. Body bias network filter capacitance 558 is connected to mid-node 556 and coupled to common node 542 via body bias network common resistance 560. Thus, body bias network filter capacitance 558 and body bias network filter common resistance 560 are in series with each other and coupled between mid-node 556 and the cell body node of each of FET unit cell circuits 524-532 via common node 542. A common resistance 562 couples a body bias voltage ("V_BIAS") node to a node 564 between body bias network filter capacitance 558 and body bias network common resistance 560. Thus, common node 542 is coupled to the V_BIAS node via resistances 560 and 562.

Body bias network filter capacitance 558 and body bias network filter common resistance 560 together define an RC-based filter that filters the cell body node voltage of each of FET unit cell circuits 524-532. This RC-based body bias network filter circuit 536 thus promotes linear operation of switch stack device 522.

Figure 18:
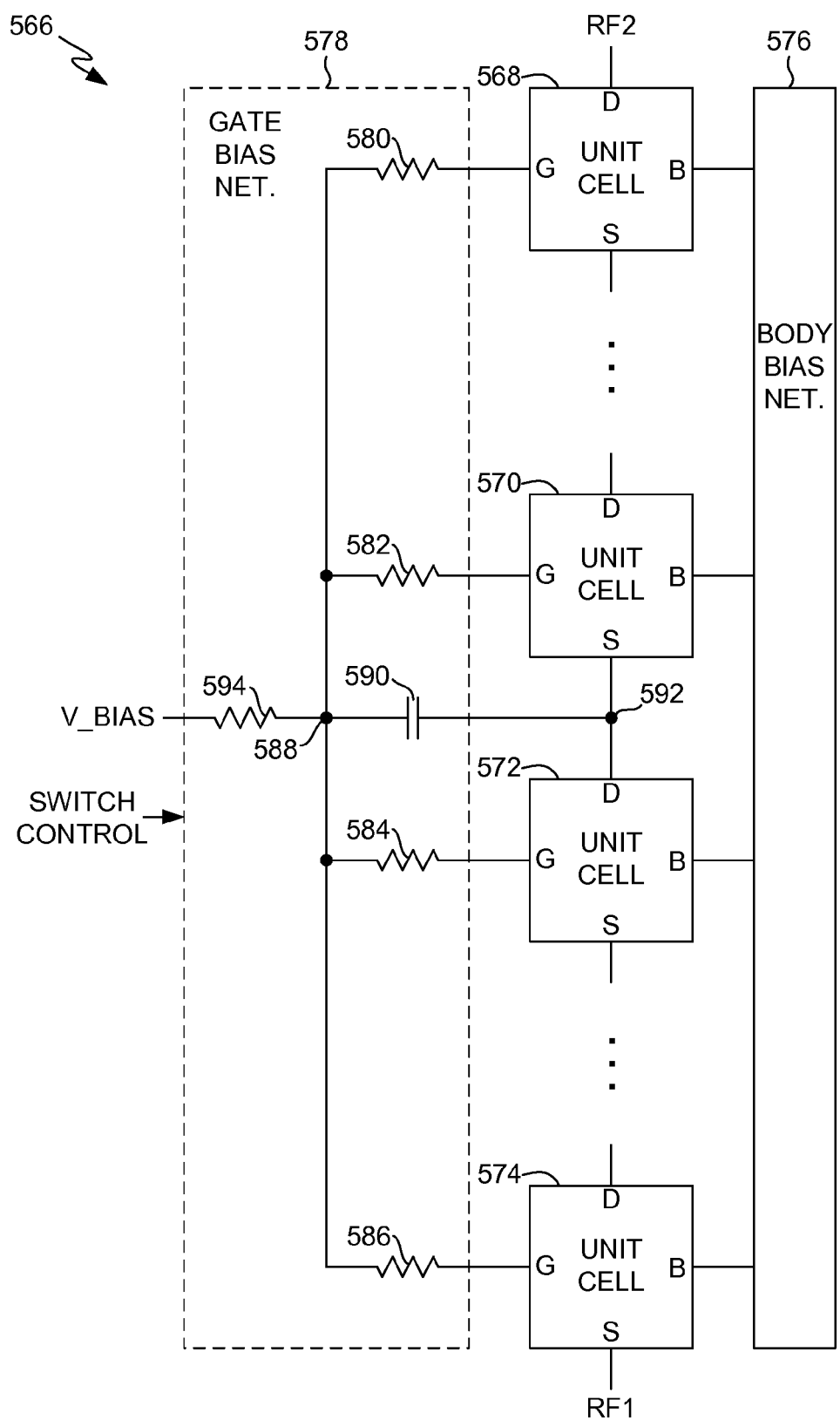
FIG. 18 is a circuit diagram illustrating a switch stack device having an even number of FET unit cell circuits and a C-based gate bias network filter circuit and having parallel gate bias resistances, in accordance with a sixteenth exemplary embodiment.

As illustrated in FIG. 18, in a sixteenth exemplary embodiment a switch stack device 566 includes a first FET unit cell circuit 568 through an Nth FET unit cell circuit 574, connected in a stack or chain topology in the same manner as described above with regard to other embodiments. In the embodiment illustrated in FIG. 18, the total number N of FET unit cell circuits 568-574 is even. Thus, half (or N/2) of the total number N of FET unit cell circuit 568-574 consist of first FET unit cell circuit 568 through an (N/2)th FET unit cell circuit 570, and the other half (or N/2) of the total number N of FET unit cell circuits 568-574 consist of an ((N/2)+1)th FET unit cell circuit 572 through Nth FET unit cell circuit 574. Stated another way, (N/2)th FET unit cell circuit 570 and (N/2)+1)th FET unit cell circuit 572 are a pair of successive FET unit cell circuits located in the middle of the chain. Further FET unit cell circuits in the chain between first FET unit cell circuit 568 and (N/2)th FET unit cell circuit 570 and between ((N/2)+1)th FET unit cell circuit 572 and Nth FET unit cell circuit 574 that are not shown for purposes of clarity are indicated by the ellipsis symbol (" . . . "). The number N of FET unit cell circuits 568-574 can be any even number greater than one.

FET unit cell circuits 568-574 can be of any of the various types described above with regard to the embodiments illustrated in FIGS. 3-12. Alternatively, FET unit cell circuits 568-574 can be of a conventional type. Switch stack device 566 can be formed on an SOI substrate or in any other suitable manner.

The cell body node of each of FET unit cell circuits 568-574 is connected to a body bias network filter circuit 576 that biases the cell body nodes as well as provides filtering in the manner described above with regard to FIGS. 13-17. That is, body bias network filter circuit 576 can comprise any of the above-described body bias network filter circuits 384, 414, 450, 502 and 536. In still other embodiments (not shown) the cell body nodes of such FET unit cell circuits can be connected to any other type of body bias network, such as one that does not provide filtering.

The cell gate node of each of FET unit cell circuits 568-574 is connected to a gate bias network filter circuit 578 that biases the cell gate nodes as well as provides filtering in the following manner. Gate bias network filter circuit 578 includes N gate bias network resistances 580-586 in parallel with each other with respect to a common node 588. That is, each of gate bias network resistances 580-586 is connected to common node 588. Each of gate bias network resistances 580-586 corresponds to one of FET unit cell circuits 568-574 and is connected to the cell gate node of that corresponding one of FET unit cell circuits 568-574. Thus, each of gate bias network resistances 580-586 is connected between the cell gate node of its corresponding one of FET unit cell circuits 568-574 and common node 588.

A gate bias network filter capacitance 590 is connected to a mid-node 592 defined by the drain-source connection between (N/2)th FET unit cell circuit 570 and ((N/2)+1)th FET unit cell circuit 572. Gate bias network filter capacitance 590 is connected between mid-node 592 and common node 588. Thus, gate bias network filter capacitance 590 is coupled between mid-node 592 and the cell gate node of each of FET unit cell circuits 568-574 via common node 588. Common node 588 is coupled to a gate bias voltage ("V_BIAS") node via a common resistance 594.

Gate bias network filter circuit 578 also receives a conventional switch control signal as an input, which can be used to operate switch stack device 566 in the manner described above with regard to other embodiments.

Gate bias network filter capacitance 590 defines a capacitance-based or C-based filter that filters the cell gate node voltage of each of FET unit cell circuits 568-574. Thus, this C-based gate bias network filter circuit 578 promotes linear operation of switch stack device 566.

Figure 19:
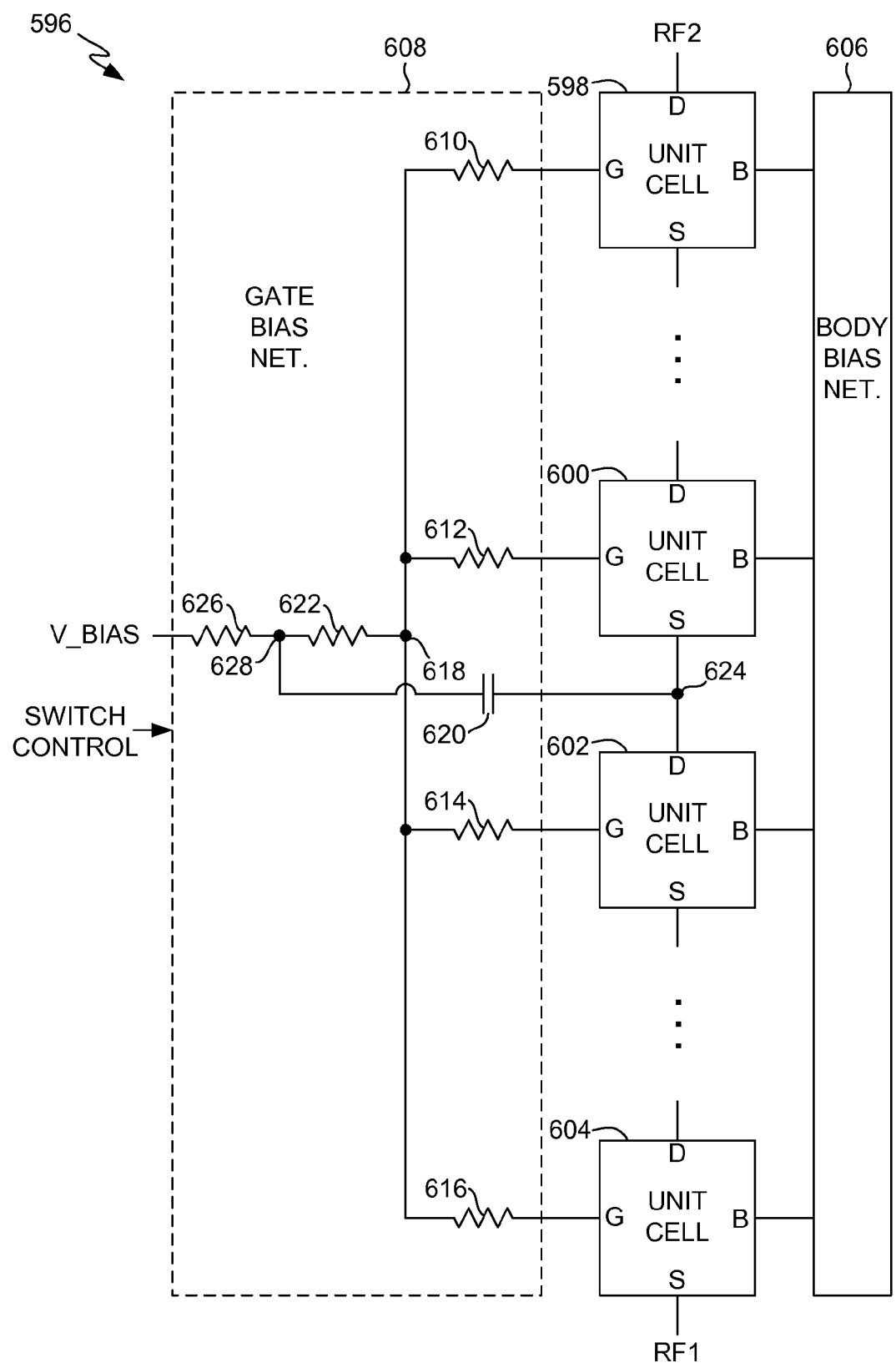
FIG. 19 is a circuit diagram illustrating a switch stack device having an even number of FET unit cell circuits and an RC-based gate bias network filter circuit and having parallel gate bias resistances, in accordance with a seventeenth exemplary embodiment.

As illustrated in FIG. 19, in a seventeenth exemplary embodiment a switch stack device 596 includes a first FET unit cell circuit 598 through an Nth FET unit cell circuit 604, connected in a stack or chain topology in the same manner as described above with regard to other embodiments. In the embodiment illustrated in FIG. 19, the total number N of FET unit cell circuits 598-604 is even. Thus, half (or N/2) of the total number N of FET unit cell circuits 598-604 consist of first FET unit cell circuit 598 through an (N/2)th FET unit cell circuit 600, and the other half (or N/2) of the total number N of FET unit cell circuits 598-604 consist of an ((N/2)+1)th FET unit cell circuit 602 through Nth FET unit cell circuit 604. Stated another way, (N/2)th FET unit cell circuit 600 and ((N/2)+1)th FET unit cell circuit 602 are a pair of successive FET unit cell circuits located in the middle of the chain. Further FET unit cell circuits in the chain between first FET unit cell circuit 598 and (N/2)th FET unit cell circuit 600 and between ((N/2)+1)th FET unit cell circuit 602 and Nth FET unit cell circuit 604 that are not shown for purposes of clarity are indicated by the ellipsis symbol (" . . . "). The number N of FET unit cell circuits 598-604 can be any even number greater than one. Switch stack device 596 can be formed on an SOI substrate or in any other suitable manner.

FET unit cell circuits 598-604 can be of any of the various types described above with regard to the embodiments illustrated in FIGS. 3-12. Alternatively, FET unit cell circuits 598-604 can be of a conventional type.

The cell body node of each of FET unit cell circuits 598-604 is connected to a body bias network filter circuit 606 that biases the cell body nodes as well as provides filtering in a manner described above with regard to FIGS. 13-17. That is, body bias network filter circuit 608 can comprise any of the above-described body bias network filter circuits 384, 414, 450, 502 and 536. In still other embodiments (not shown) the cell body nodes of such FET unit cell circuits can be connected to any other type of body bias network, such as one that does not provide filtering.

The cell gate node of each of FET unit cell circuits 598-604 is connected to a gate bias network filter circuit 608 that biases the cell gate nodes as well as provides filtering in the following manner. Gate bias network filter circuit 608 includes N gate bias network resistances 610-616 in parallel with each other with respect to a common node 618. That is, each of gate bias network resistances 610-616 is connected to common node 618. Each of gate bias network resistances 610-616 corresponds to one of FET unit cell circuits 598-604 and is connected to the cell gate node of that corresponding one of FET unit cell circuits 598-604. Thus, each of gate bias network resistances 610-616 is connected between the cell gate node of its corresponding one of FET unit cell circuits 598-604 and common node 618.

Gate bias network filter circuit 608 also includes a gate bias network filter capacitance 620 and a gate bias network common resistance 622. Gate bias network filter capacitance 620 is connected to a mid-node 624 defined by the drain-source connection between (N/2)th FET unit cell circuit 600 and ((N/2)+1)th FET unit cell circuit 602. Gate bias network filter capacitance 620 is coupled to common node 618 via gate bias network filter common resistance 622. Thus, gate bias network filter capacitance 620 and gate bias network common resistance 622 are in series with each other and coupled between mid-node 624 and the cell gate node of each of FET unit cell circuits 598-604 via common node 618. A common resistance 626 couples a gate bias voltage ("V_BIAS") node to a node 628 between gate bias network filter capacitance 620 and gate bias network common resistance 622. Thus, common node 618 is coupled to the V_BIAS node via resistances 622 and 626.

Gate bias network filter circuit 608 also receives a conventional switch control signal as an input, which can be used to operate switch stack device 596 in the manner described above with regard to other embodiments.

Gate bias network filter capacitance 620 and gate bias network filter common resistance 622 together define an RC-based filter that filters the cell body node voltage of each of FET unit cell circuits 598-604. This RC-based gate bias network filter circuit 608 thus promotes linear operation of switch stack device 596.

Figure 20:
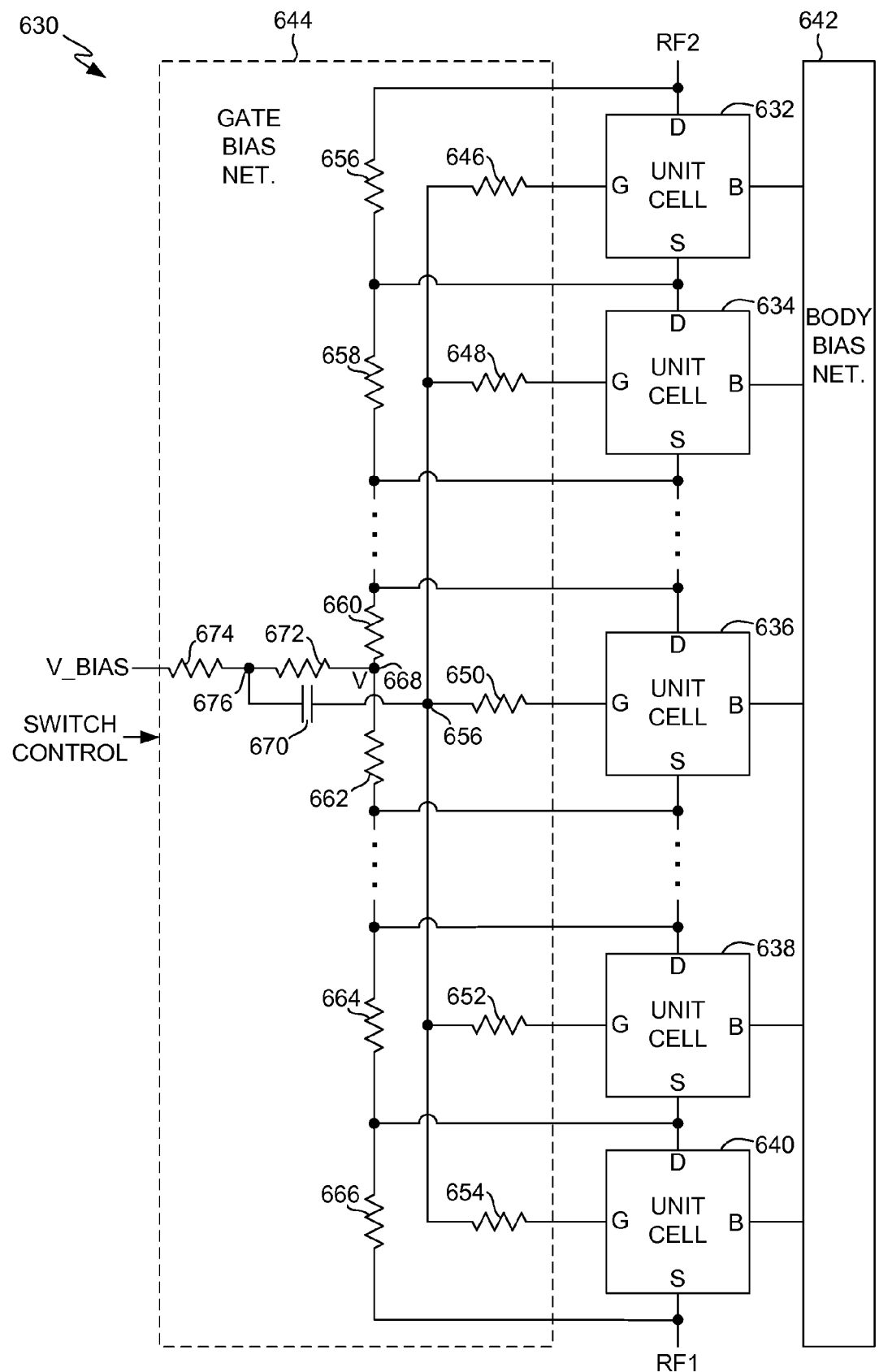
FIG. 20 is a circuit diagram illustrating a switch stack device having an odd number of FET unit cell circuits and an RC-based gate bias network filter circuit and having parallel gate bias resistances, in accordance with an eighteenth exemplary embodiment.

As illustrated in FIG. 20, in an eighteenth exemplary embodiment a switch stack device 630 includes a first FET unit cell circuit 632 through an Nth FET unit cell circuit 640, connected in a stack or chain topology in the same manner as described above with regard to other embodiments. Thus, the chain begins with the cell source node of first FET unit cell circuit 632 connected to the cell drain node of a second FET unit cell circuit 634, and continues through the cell source node of an (N−1)th FET unit cell circuit 638 connected to the cell drain node of Nth FET unit cell circuit 640. In the embodiment illustrated in FIG. 20, the total number N of FET unit cell circuits 632-640 is odd. Thus, an ((N+1)/2)th FET unit cell circuit 636 is located in the middle of the chain. Further FET unit cell circuits in the chain between second FET unit cell circuit 634 and ((N+1)/2)th FET unit cell circuit 636 and between ((N+1)/2)th FET unit cell circuit 636 and (N−1)th FET unit cell circuit 638 that are not shown for purposes of clarity are indicated by the ellipsis symbol (" . . . "). The number N of FET unit cell circuits 632-640 can be any odd number greater than one. Switch stack device 630 can be formed on an SOI substrate or in any other suitable manner.

FET unit cell circuits 632-640 can be of any of the various types described above with regard to the embodiments illustrated in FIGS. 3-12. Alternatively, FET unit cell circuits 632-640 can be of a conventional type.

The cell body of each of FET unit cell circuits 438-446 is connected to a body bias network filter circuit 642 that biases the cell body nodes as well as provides filtering in a manner described above with regard to FIGS. 13-17. That is, body bias network filter circuit 642 can comprise any of the above-described body bias network filter circuits 384, 414, 450, 502 and 536. In still other embodiments (not shown) the cell body nodes of such FET unit cell circuits can be connected to any other type of body bias network, such as one that does not provide filtering.

The cell gate node of each of FET unit cell circuits 632-640 is connected to a gate bias network filter circuit 644 that biases the cell gate nodes as well as provides filtering in the following manner. Gate bias network filter circuit 644 includes N gate bias network resistances 646-654 in parallel with each other with respect to a common node 676. That is, each of gate bias network resistances 646-654 is connected to common node 676. Each of gate bias network resistances 646-654 corresponds to one of FET unit cell circuits 632-640 and is connected to the cell gate node of that corresponding one of FET unit cell circuits 632-640. Thus: first gate bias network resistance 646 is connected to the cell gate node of first FET unit cell circuit 632; second gate bias network resistance 648 is connected to the cell gate node of second FET unit cell circuit 634; and so on, through an ((N+1)/2)th gate bias network resistance 650, which is connected to the cell gate node of ((N+1)/2)th FET unit cell circuit 636; and so on, through an (N−1)th gate bias network resistance 652, which is connected to the cell gate node of (N−1)th FET unit cell circuit 638; and finally Nth gate bias network resistance 654, which is connected to the cell gate node of Nth FET unit cell circuit 640. Each of gate bias network resistances 646-654 is connected between the cell gate node of its corresponding one of FET unit cell circuits 632-640 and common node 676.

Gate bias network filter circuit 644 also includes N+1 drain-source resistances 656-666 connected in series with each other. Each of drain-source resistances 656-666 corresponds to one of FET unit cell circuits 632-640 and is connected between the cell drain node and cell source node of its corresponding one of FET unit cell circuits 632-640. Thus: the first drain-source resistance 656 is connected between the cell drain node and cell source node of FET unit cell circuit 632; a second drain-source resistance 658 is connected between the cell drain node and cell source node of second FET unit cell circuit 634; and so on, through an Nth drain-source resistance 664, which is connected between the cell drain node and cell source node of (N−1)th FET unit cell circuit 638; and finally an (N+1)th drain-source resistance 666, which is connected between the cell drain node and cell source node of Nth FET unit cell circuit 640. In this embodiment, a mid-node 668 (i.e., a virtual node V) is defined between an (N/2)th drain-source resistance 660 and an ((N/2)+1)th drain-source resistance 662. The (N/2)th drain-source resistance 660 and ((N/2)+1)th drain-source resistance 662 are in series with each other and connected between the cell drain node and cell source node of ((N+1)/2)th FET unit cell circuit 636 in the middle of the chain. The (N/2)th drain-source resistance 660 and ((N+1)/2+1)th drain-source resistance 662 both correspond to ((N+1)/2)th FET unit cell circuit 636. Stated another way, except for the cell drain and source nodes of ((N+1)/2)th FET unit cell circuit 636, which are connected by drain-source resistances 660 and 662 in series, only a single drain-source resistance is connected between the cell drain and source nodes of each corresponding FET unit cell circuit. It can be noted that mid-node 668 is also located between the cell drain node and cell source node of ((N+1)/2)th FET unit cell circuit 636. It can also be noted that mid-node 668 is located between a first series-connected group of (N+1)/2 of drain-source resistances 656-660 and a second series-connected group of (N+1)/2 of drain-source resistances 662-666.

Gate bias network filter circuit 644 also includes a gate bias network filter capacitance 670 and a gate bias network common resistance 672. Gate bias network filter capacitance 670 is connected to mid-node 668 and coupled to common node 656 via gate bias network common resistance 672. Thus, gate bias network filter capacitance 670 and gate bias network common resistance 672 are in series with each other and coupled between mid-node 668 and the cell gate node of each of FET unit cell circuits 632-640 via common node 656. A common resistance 674 couples a gate bias voltage ("V_BIAS") node to a node 676 between gate bias network filter capacitance 670 and gate bias network common resistance 672. Thus, common node 656 is coupled to the V_BIAS node via resistances 672 and 674.

Gate bias network filter circuit 644 also receives a conventional switch control signal as an input, which can be used to operate switch stack device 630 in the manner described above with regard to other embodiments.

Gate bias network filter capacitance 670 and gate bias network filter common resistance 672 together define an RC-based filter that filters the cell gate node voltage of each of FET unit cell circuits 632-640. This RC-based gate bias network filter circuit 644 thus promotes linear operation of switch stack device 630.

Figure 21:
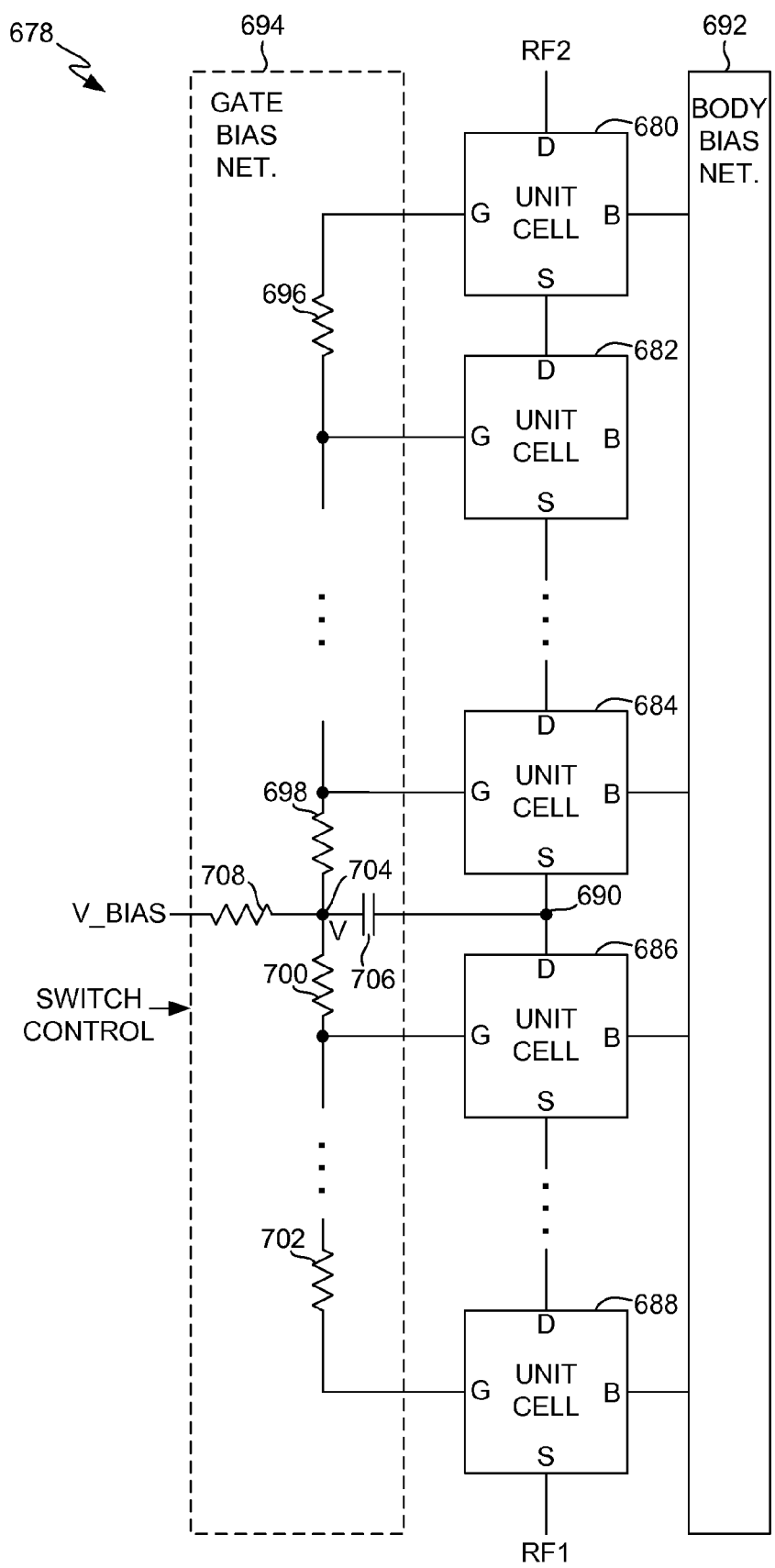
FIG. 21 is a circuit diagram illustrating a switch stack device having an odd number of FET unit cell circuits and a C-based gate bias network filter circuit and having series gate bias resistances, in accordance with an nineteenth exemplary embodiment.

As illustrated in FIG. 21, in a nineteenth exemplary embodiment a switch stack device 678 includes a first FET unit cell circuit 680 through an Nth FET unit cell circuit 688, connected in a stack or chain topology in the same manner as described above with regard to other embodiments. In the embodiment illustrated in FIG. 21, the total number N of FET unit cell circuits 680-688 is even. Thus, half (or N/2) of the total number N of FET unit cell circuits 680-688 consist of first FET unit cell circuit 680, a second FET unit cell circuit 682, etc., through an (N/2)th FET unit cell circuit 684, and the other half (or N/2) of the total number N of FET unit cell circuits 680-688 consist of an ((N/2)+1)th FET unit cell circuit 686 through Nth FET unit cell circuit 688. Stated another way, (N/2)th FET unit cell circuit 684 and ((N/2)+1)th FET unit cell circuit 686 are a pair of successive FET unit cell circuits located in the middle of the chain. A mid-node 690 is defined by the drain-source connection between the cell source node of (N/2)th FET unit cell circuit 684 and the cell drain node of ((N/2)+1)th FET unit cell circuit 686. Further FET unit cell circuits in the chain between second FET unit cell circuit 682 and (N/2)th FET unit cell circuit 684 and between ((N/2)+1)th FET unit cell circuit 686 and Nth FET unit cell circuit 688 that are not shown for purposes of clarity are indicated by the ellipsis symbol (" . . . "). The number N of FET unit cell circuits 680-688 can be any even number greater than one. Switch stack device 678 can be formed on an SOI substrate or in any other suitable manner.

FET unit cell circuits 680-688 can be of any of the various types described above with regard to the embodiments illustrated in FIGS. 3-12. Alternatively, FET unit cell circuits 680-688 can be of a conventional type.

The cell body node of each of FET unit cell circuits 680-688 is connected to a body bias network filter circuit 692 that biases the cell body nodes as well as provides filtering in a manner described above with regard to FIGS. 13-17. That is, body bias network filter circuit 692 can comprise any of the above-described body bias network filter circuits 384, 414, 450, 502 and 536. In still other embodiments (not shown) the cell body nodes of such FET unit cell circuits can be connected to any other type of body bias network, such as one that does not provide filtering.

The cell gate node of each of FET unit cell circuits 680-688 is connected to a gate bias network filter circuit 694 that biases the cell gate nodes as well as provides filtering in the following manner. Gate bias network filter circuit 694 includes N gate bias network resistances 696-702 in series with each other. Each of gate bias network resistances 696-702 is coupled between the cell gate nodes of a pair of successive FET unit cell circuits in the chain. For example, the first gate bias network resistance 696 is connected between the cell gate node of first FET unit cell circuit 680 and the cell gate node of second FET unit cell circuit 682. In this embodiment, a common node 704 (i.e., a virtual node V) is defined between an (N/2)th gate bias network resistance 698 and an ((N/2)+1)th gate bias network resistance 700. The (N/2)th gate bias network resistance 698 and ((N/2)+1)th gate bias network resistance 700 are in series with each other and connected between the cell gate node of (N/2)th FET unit cell circuit 684 and ((N/2)+1)th FET unit cell circuit 686. Except for the successive FET unit cell circuit pair consisting of (N/2)th FET unit cell circuit 684 and ((N/2)+1)th FET unit cell circuit 686, which are connected by gate bias network resistances 698 and 700 in series, only a single gate bias network resistance is connected between each successive FET unit cell circuit pair. It can be noted that common node 704 is located between the a first series-connected group of N/2 of gate bias network resistances 696-698 and a second series-connected group of N/2 of gate bias network resistances 700-702.

Gate bias network filter circuit 694 also includes a gate bias network filter capacitance 706. Gate bias network filter capacitance 706 is coupled between mid-node 690 and common node 704. A common resistance 708 couples a gate bias voltage ("V_BIAS") node to common node 704 between resistances 698 and 700 and gate bias network filter capacitance 706.

Gate bias network filter circuit 694 also receives a conventional switch control signal as an input, which can be used to operate switch stack device 678 in the manner described above with regard to other embodiments.

Gate bias network filter capacitance 706 and resistances 698 and 700 together define an RC-based filter that filters the cell gate node voltage of each of FET unit cell circuits 680-688. This RC-based gate bias network filter circuit 694 thus promotes linear operation of switch stack device 678.

Figure 22:
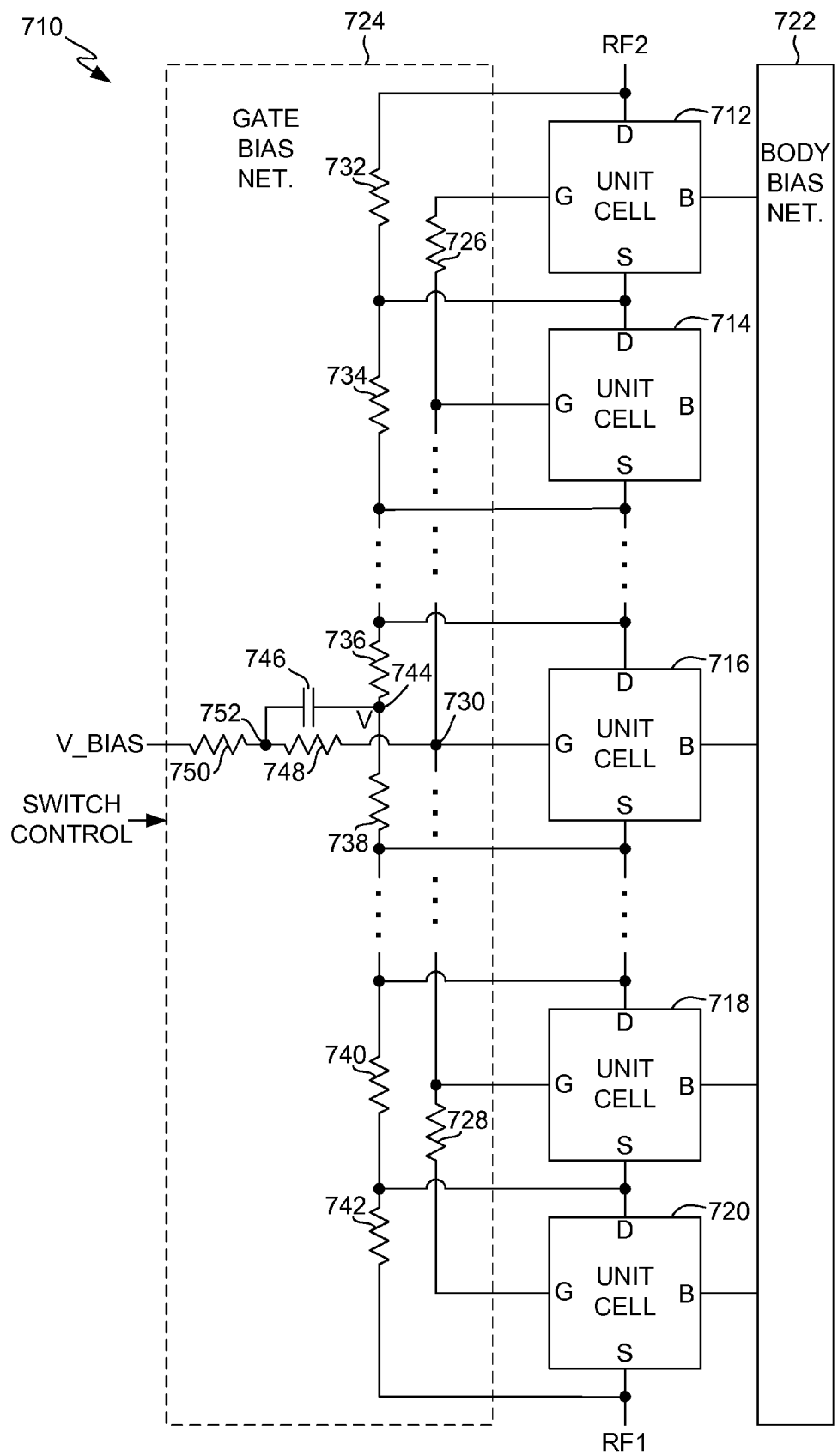
FIG. 22 is a circuit diagram illustrating a switch stack device having an odd number of FET unit cell circuits and an RC-based gate bias network filter circuit and having series gate bias resistances, in accordance with an twentieth exemplary embodiment.

As illustrated in FIG. 22, in a twentieth exemplary embodiment a switch stack device 710 includes a first FET unit cell circuit 712 through an Nth FET unit cell circuit 720, connected in a stack or chain topology in the same manner as described above with regard to other embodiments. Thus, the chain begins with the cell source node of first FET unit cell circuit 712 connected to the cell drain node of second FET unit cell circuit 714, and continues through the cell source node of the (N−1)th FET unit cell circuit 718 connected to the cell drain node of Nth FET unit cell circuit 720. In the embodiment illustrated in FIG. 22, the total number N of FET unit cell circuits 712-720 is odd. Thus, an ((N+1)/2)th FET unit cell circuit 716 is located in the middle of the chain. Further FET unit cell circuits in the chain between second FET unit cell circuit 714 and ((N+1)/2)th FET unit cell circuit 716 and between ((N+1)/2)th FET unit cell circuit 716 and (N−1)th FET unit cell circuit 718 that are not shown for purposes of clarity are indicated by the ellipsis symbol (" . . . "). The number N of FET unit cell circuits 712-720 can be any odd number greater than one. Switch stack device 710 can be formed on an SOI substrate or in any other suitable manner.

FET unit cell circuits 712-720 can be of any of the various types described above with regard to the embodiments illustrated in FIGS. 3-12. Alternatively, FET unit cell circuits 712-720 can be of a conventional type.

The cell body node of each of FET unit cell circuits 712-720 is connected to a body bias network filter circuit 722 that biases the cell body nodes as well as provides filtering in a manner described above with regard to FIGS. 13-17. That is, body bias network filter circuit 722 can comprise any of the above-described body bias network filter circuits 384, 414, 450, 502 and 536. In still other embodiments (not shown) the cell body nodes of such FET unit cell circuits can be connected to any other type of body bias network, such as one that does not provide filtering.

The cell gate node of each of FET unit cell circuits 712-720 is connected to a gate bias network filter circuit 724 that biases the cell gate nodes as well as provides filtering in the following manner. Gate bias network filter circuit 724 includes N gate bias network filter resistances 726-728 in series with each other. Each of gate bias network resistances 726-728 is coupled between the cell gate nodes of a pair of successive FET unit cell circuits in the chain. For example, the first gate bias network resistance 726 is connected between the cell gate node of first FET unit cell circuit 712 and the cell gate node of second FET unit cell circuit 714, and an Nth gate bias network resistance 728 is connected between the cell gate node of (N−1)th FET unit cell circuit 718 and the cell gate node of Nth FET unit cell circuit 720. In this embodiment, a common node 730 is defined by the cell gate node of ((N+1)/2)th FET unit cell circuit 716 in the middle of the chain. Common node 730 is thus located between a first series-connected group of (N−1)/2 of gate bias network resistances and a second series-connected group of (N−1)/2 of gate bias network resistances.

Gate bias network filter circuit 724 also includes N+1 drain-source resistances 732-742 connected in series with each other. Each of drain-source resistances 732-742 corresponds to one of FET unit cell circuits 712-720 and is connected between the cell drain node and cell source node of its corresponding one of FET unit cell circuits 712-720. Thus: the first drain-source resistance 732 is connected between the cell drain node and cell source node of first FET unit cell circuit 712; a second drain-source resistance 734 is connected between the cell drain node and cell source node of second FET unit cell circuit 714; and so on, through an Nth drain-source resistance 740, which is connected between the cell drain node and cell source node of (N−1)th FET unit cell circuit 718; and finally an (N+1)th drain-source resistance 742, which is connected between the cell drain node and cell source node of Nth FET unit cell circuit 720. In this embodiment, a mid-node 744 (i.e., a virtual node V) is defined between an (N/2)th drain-source resistance 736 and an ((N/2)+1)th drain-source resistance 738. The (N/2)th drain-source resistance 736 and ((N/2)+1)th drain-source resistance 738 are in series with each other and connected between the cell drain node and cell source node of ((N+1)/2)th FET unit cell circuit 528 in the middle of the chain. The (N/2)th drain-source resistance 736 and ((N/2)+1)th drain-source resistance 738 both correspond to ((N+1)/2)th FET unit cell circuit 716. Stated another way, except for the cell drain and source nodes of FET unit cell circuit 716, which are connected by drain-source resistances 736 and 738 in series, only a single drain-source resistance is connected between the cell drain and source nodes of each corresponding FET unit cell circuit. It can be noted that mid-node 744 is also located between the cell drain node and cell source node of ((N+1)/2)th FET unit cell circuit 716. It can also be noted that mid-node 744 is located between a first series-connected group of (N+1)/2 of drain-source resistances 732-736 and a second series-connected group of (N+1)/2 of drain-source resistances 738-742.

Gate bias network filter circuit 724 also includes a gate bias network filter capacitance 746 and a gate bias network filter common resistance 748. Gate bias network filter capacitance 746 is connected to mid-node 744 and coupled to common node 730 via gate bias network filter common resistance 748. Thus, gate bias network filter capacitance 746 and gate bias network filter common resistance 748 are in series with each other and coupled between mid-node 744 and the cell gate node of each of FET unit cell circuits 712-720 via common node 730. A common resistance 750 couples a gate bias voltage ("V_BIAS") node to a node 752 between gate bias network filter capacitance 746 and gate bias network filter common resistance 748. Thus, common node 730 is coupled to the V_BIAS node via resistances 748 and 750.

Gate bias network filter circuit 724 also receives a conventional switch control signal as an input, which can be used to operate switch stack device 710 in the manner described above with regard to other embodiments.

Gate bias network filter capacitance 746 and gate bias network filter common resistance 748 together define an RC-based filter that filters the cell gate node voltage of each of FET unit cell circuits 712-720. This RC-based gate bias network filter circuit 724 thus promotes linear operation of switch stack device 710.

Figure 23:
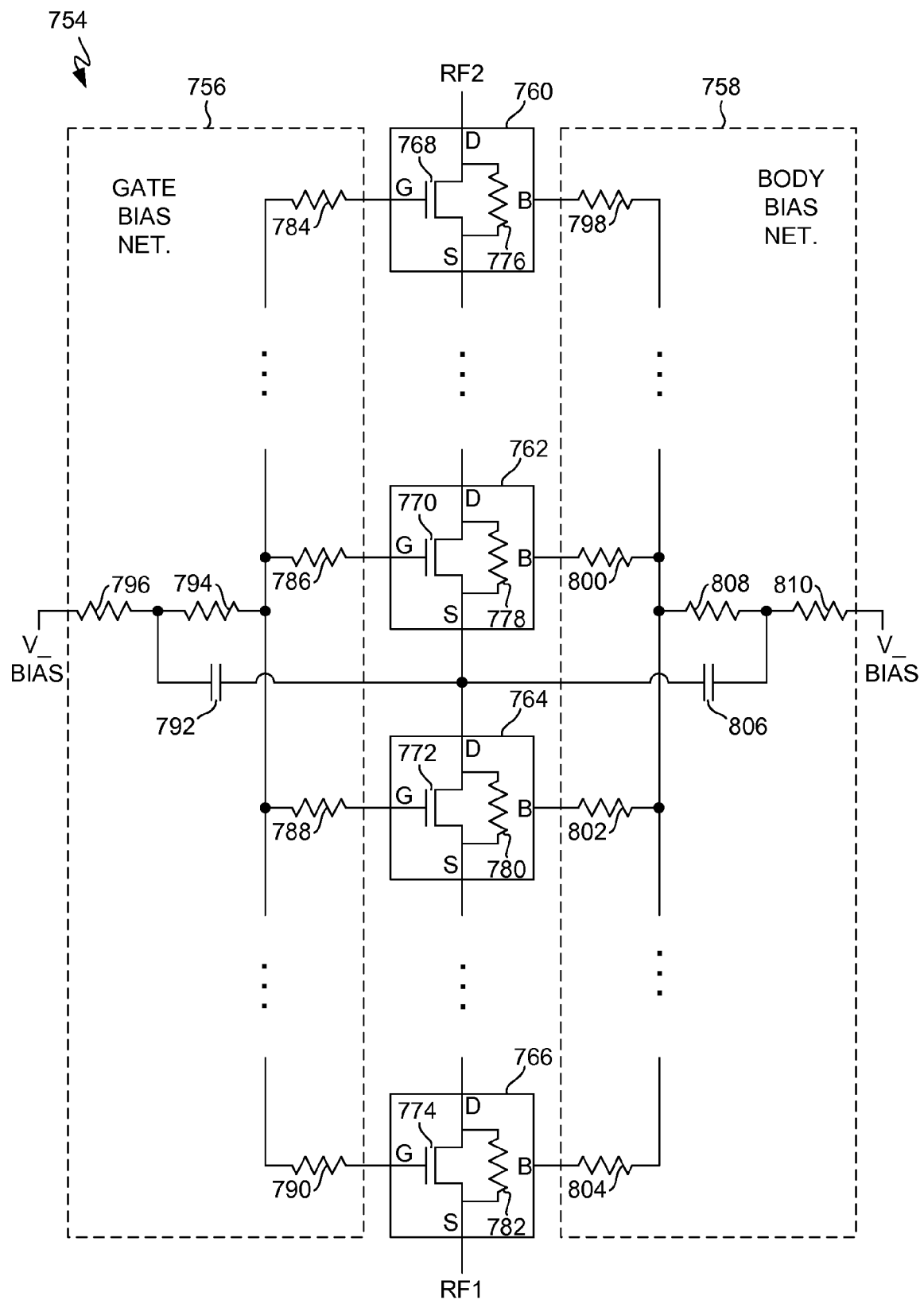
FIG. 23 is a circuit diagram illustrating an example of a switch stack device having an even number of FET unit cell circuits, an RC-based gate bias network filter circuit, parallel gate bias resistances, an RC-based body bias network filter circuit, and parallel body bias resistances.

The foregoing embodiments can be combined in various ways. As illustrated in FIG. 23, a switch stack device 754 represents an example in which a conventional type of FET unit cell circuit is combined with a gate bias network filter circuit 756 of the parallel-resistance type described above with regard to FIG. 19 and a body bias network filter circuit 758 of the parallel-resistance type described above with regard to FIG. 14. Switch stack device 754 includes an even number of FET unit cell circuits 760 through 762 and 764 through 766 connected in the same manner as described above with regard to FIGS. 13, 14, 16, 18, 19 and 21. Each of FET unit cell circuits 760-766 is of a conventional structure, comprising FETs 768 through 770 and 772 through 774, respectively, and drain-source bias resistors 776 through 778 and 780 through 782, respectively. Each of FET unit cell circuits 760-766 is connected to gate bias network filter circuit 756 and body bias network filter circuit 758 in the manner described above with regard to other embodiments. As gate bias network filter circuit 756 is identical to gate bias network filter circuit 608 described above with regard to FIG. 19, it can be noted that gate bias network filter circuit 756 includes: N gate bias network resistances 784 through 786 and 788 through 790 in parallel with each other; a gate bias network filter capacitance 792; a gate bias network filter common resistance 794; and a common resistance 796. As body bias network filter circuit 758 is identical to body bias network filter circuit 414 described above with regard to FIG. 14, it can be noted that body bias network filter circuit 758 includes: N body bias network filter resistances 798 through 800 and 802 through 804 in parallel with each other; a body bias network filter capacitance 808; a body bias network filter common resistance 808; and a common resistance 810.

Figure 24:
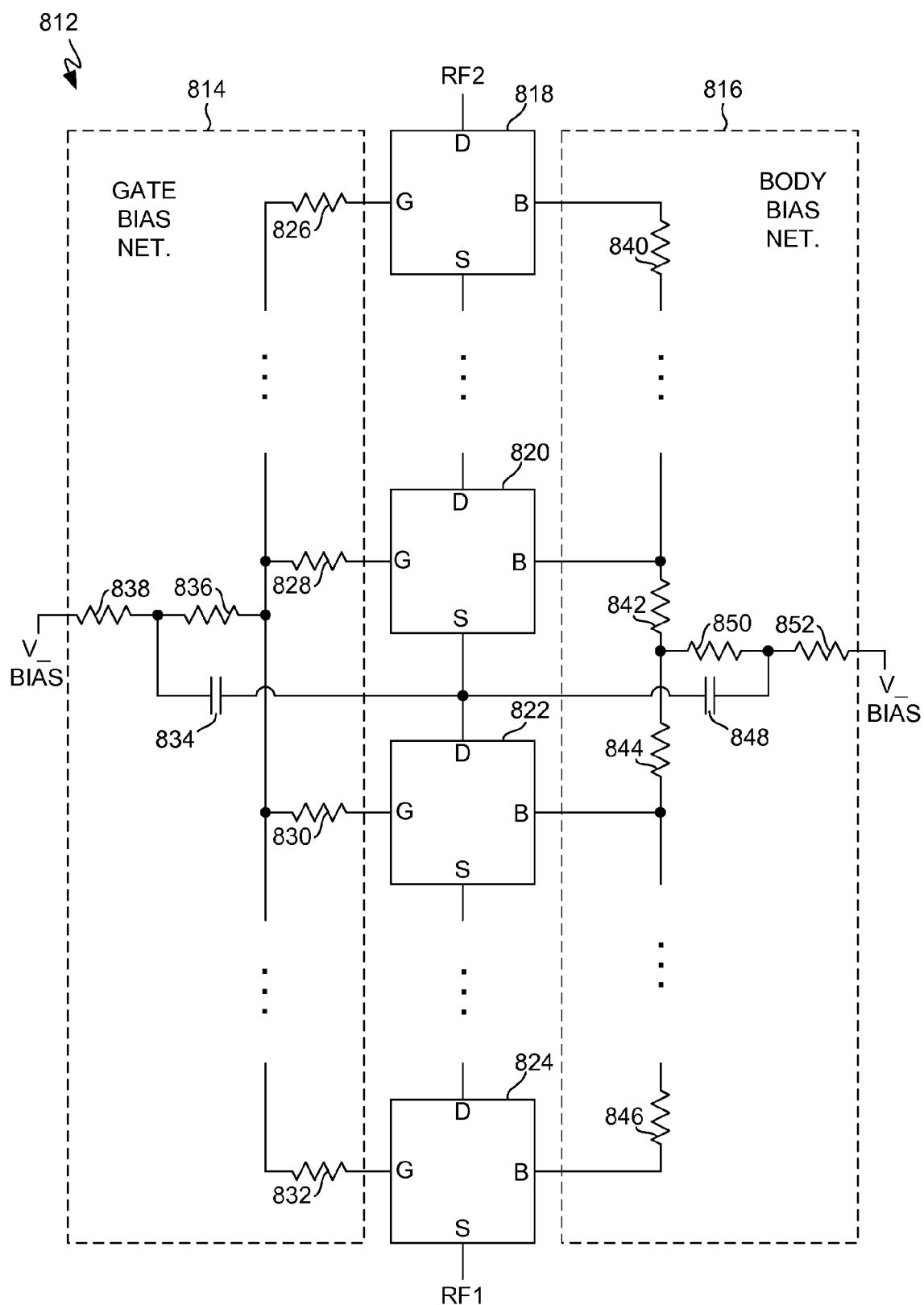
FIG. 24 is a circuit diagram illustrating an example of a switch stack device having an even number of FET unit cell circuits, an RC-based gate bias network filter circuit, parallel gate bias resistances, an RC-based body bias network filter circuit, and series body bias resistances.

As illustrated in FIG. 24, a switch stack device 812 represents an example in which the type of FET unit cell circuit described above with regard to FIG. 4 is combined with a gate bias network filter circuit 814 of the parallel-resistance type described above with regard to FIG. 19 and a body bias network filter circuit 816 of the series-resistance type described above with regard to FIG. 16. Switch stack device 812 includes an even number of FET unit cell circuits 818 through 820 and 822 through 824 connected in the same manner as described above with regard to FIGS. 13, 14, 16, 18, 19 and 21. Each of FET unit cell circuits 818-824 is identical to FET unit cell circuits 62-66 described above with regard to FIG. 4. Each of FET unit cell circuits 818-824 is connected to gate bias network filter circuit 814 and body bias network filter circuit 816 in the manner described above with regard to other embodiments. As gate bias network filter circuit 814 is identical to gate bias network filter circuit 608 described above with regard to FIG. 19, it can be noted that gate bias network filter circuit 814 includes: N gate bias network resistances 826 through 828 and 830 through 832 in parallel with each other; a gate bias network filter capacitance 834; a gate bias network filter common resistance 836; and a common resistance 838. As body bias network filter circuit 816 is identical to body bias network filter circuit 502 described above with regard to FIG. 16, it can be noted that body bias network filter circuit 816 includes: N body bias network resistances 840 through 842 and 844 through 846 in series with each other; a body bias network filter capacitance 848; a body bias network filter common resistance 850; and a common resistance 852.

Figure 25:
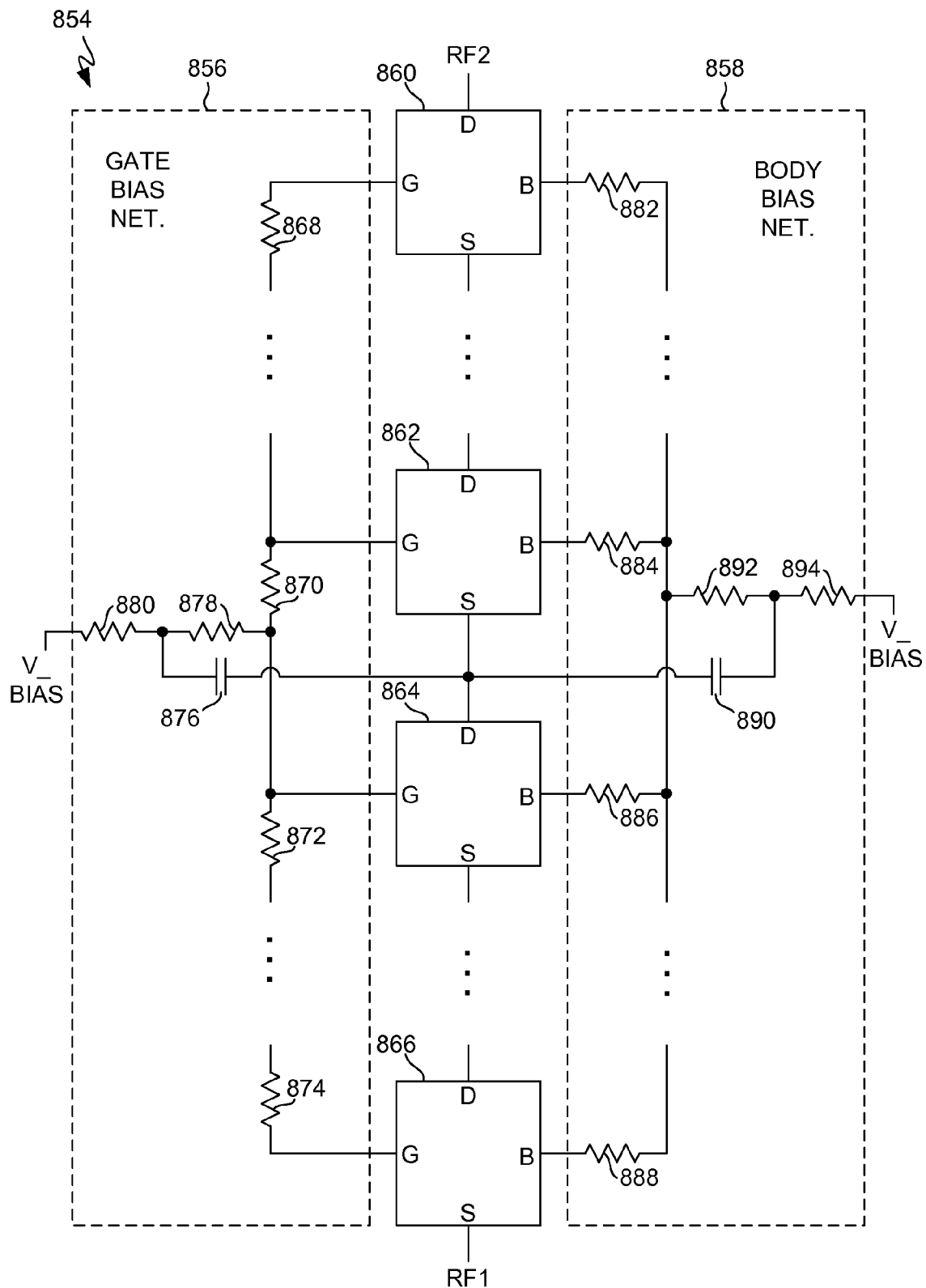
FIG. 25 is a circuit diagram illustrating an example of a switch stack device having an even number of FET unit cell circuits, an RC-based gate bias network filter circuit, series gate bias resistances, an RC-based body bias network filter circuit, and parallel body bias resistances.

As illustrated in FIG. 25, a switch stack device 854 represents an example in which the type of FET unit cell circuit described above with regard to FIG. 8 is combined with a gate bias network filter circuit 856 of the series-resistance type described above with regard to FIG. 22 and a body bias network filter circuit 858 of the parallel-resistance type described above with regard to FIG. 14. Switch stack device 854 includes an even number of FET unit cell circuits 860 through 862 and 864 through 866 connected in the same manner as described above with regard to FIGS. 13, 14, 16, 18, 19 and 21. Each of FET unit cell circuits 860-866 is identical to FET unit cell circuits 174-176 described above with regard to FIG. 8. Each of FET unit cell circuits 860-866 is connected to gate bias network filter circuit 856 and body bias network filter circuit 858 in the manner described above with regard to other embodiments. As gate bias network filter circuit 856 is similar to gate bias network filter circuit 724 described above with regard to FIG. 22, it can be noted that gate bias network filter circuit 856 includes: N gate bias network resistances 868 through 870 and 872 through 874 in series with each other; a gate bias network filter capacitance 876; a gate bias network filter common resistance 878; and a common resistance 880. As body bias network filter circuit 858 is identical to body bias network filter circuit 414 described above with regard to FIG. 14, it can be noted that body bias network filter circuit 858 includes: N body bias network resistances 882 through 884 and 886 through 888 in series with each other; a body bias network filter capacitance 890; a body bias network filter common resistance 892; and a common resistance 894.

Figure 26:
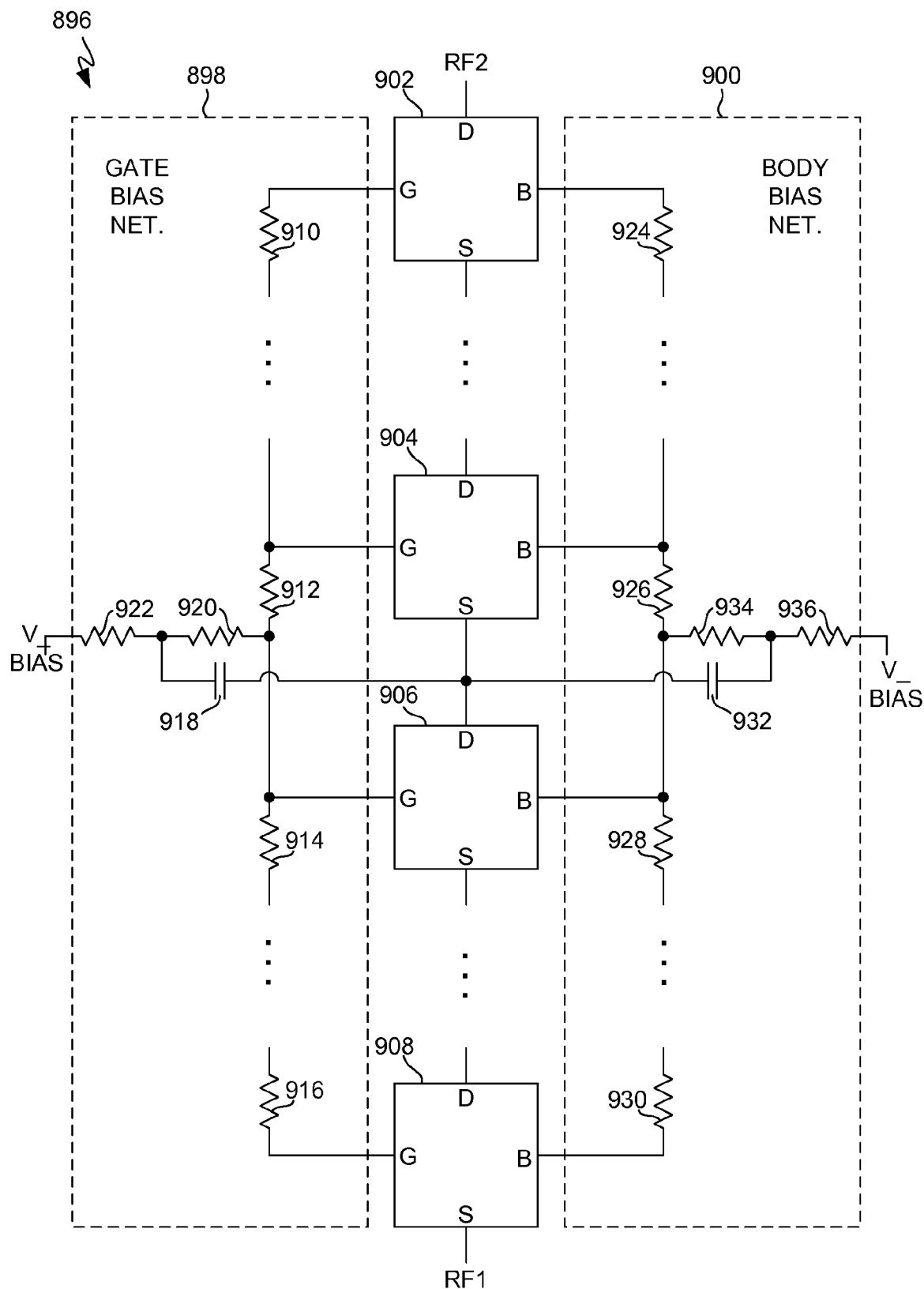
FIG. 26 is a circuit diagram illustrating an example of a switch stack device having an even number of FET unit cell circuits, an RC-based gate bias network filter circuit, series gate bias resistances, an RC-based body bias network filter circuit, and series body bias resistances.

As illustrated in FIG. 26 a switch stack device 896 represents an example in which the type of FET unit cell circuit described above with regard to FIG. 12 is combined with a gate bias network filter circuit 898 of the series-resistance type described above with regard to FIG. 22 and a body bias network filter circuit 900 of the series-resistance type described above with regard to FIG. 16. Switch stack device 896 includes an even number of FET unit cell circuits 902 through 904 and 906 through 908 connected in the same manner as described above with regard to FIGS. 13, 14, 16, 18, 19 and 21. Each of FET unit cell circuits 902-908 is identical to FET unit cell circuits 308-310 described above with regard to FIG. 12. Each of FET unit cell circuits 902-908 is connected to gate bias network filter circuit 898 and body bias network filter circuit 900 in the manner described above with regard to other embodiments. As gate bias network filter circuit 898 is similar to gate bias network filter circuit 724 described above with regard to FIG. 22, it can be noted that gate bias network filter circuit 898 includes: N gate bias network resistances 910 through 912 and 914 through 916 in series with each other; a gate bias network filter capacitance 918; a gate bias network filter common resistance 920; and a resistance 922. As body bias network filter circuit 900 is identical to body bias network filter circuit 502 described above with regard to FIG. 16, it can be noted that body bias network filter circuit 900 includes: N body bias network resistances 924 through 926 and 928 through 930 in series with each other; a body bias network filter capacitance 932; a body bias network filter common resistance 934; and a resistance 936.

The examples illustrated in FIGS. 23-26 represent only a portion of the various combinations of the above-described types of FET unit cell circuits, gate bias network filter circuits, and body bias network filter circuits that one of ordinary skill in the art will recognize are possible. In view of the descriptions herein, other such combinations will occur readily to one of ordinary skill in the art.

Although selected aspects have been illustrated and described in detail, it will be understood that various substitutions and alterations may be made therein without departing from the spirit and scope of the present invention, as defined by the following claims.

What is claimed is:

1. A device for switching a radio frequency (RF) signal, comprising:
 a plurality of field-effect transistors (FET) unit cell circuits configured as a FET stack, each FET unit cell circuit comprising a FET;
 a bias network circuit coupled to the FET stack; and
 a body filter included in the plurality of FET unit cell circuits, the body filter having a drain-source circuit, the drain-source circuit comprising a divider circuit defining a virtual node, the body filter including a body filter capacitance between a body node of the FET and the virtual node.

2. The device of claim 1, further comprising a gate filter having a gate filter capacitance coupled to the virtual node.

3. The device of claim 2, wherein the divider circuit comprises a first capacitance in series with a second capacitance, the virtual node is defined between the first capacitance and the second capacitance, and the gate filter comprises a gate filter resistance coupled between the virtual node and a gate node of the FET.

4. The device of claim 1, wherein each FET unit cell circuit of the plurality of FET unit cell circuits comprises a first FET and a second FET, the device further comprising:
 a first body filter having a first body filter capacitance coupled between a body node of the first FET and a gate node of the first FET; and
 a second body filter having a second body filter capacitance coupled between a body node of the second FET and a gate node of the second FET.

5. The device of claim 4, further comprising a shared body filter capacitance coupled between a source node of the first FET and the body node of the first FET and coupled between a drain node of the second FET and the body node of the second FET.

6. The device of claim 1, wherein the plurality of FET unit cell circuits are formed on a silicon-on-insulator (SOI) substrate.

7. A device for switching a radio frequency (RF) signal, comprising:
 a plurality of field-effect transistors (FET) unit cell circuits configured as a FET stack, each FET unit cell circuit comprising a FET; and
 a body bias network filter circuit coupled to a body node of each FET unit cell circuit, the body bias network filter circuit having a mid-node coupled to at least one drain-source node between a pair of successive FET unit cell circuits, the body bias network filter circuit having a body bias network filter capacitance coupled between the mid-node and the body node of each FET unit cell circuit.

8. The device of claim 7, wherein the body bias network filter circuit comprises a plurality of body bias network resistances in parallel with each other with respect to a common node of the body bias network filter circuit, each body bias network resistance corresponding to one of the plurality of FET unit cell circuits, each body bias network resistance connected between the common node and the body node of a corresponding FET unit cell circuit.

9. The device of claim 7, wherein the body bias network filter circuit comprises a plurality of body bias network resistances in series with each other, and each body bias network resistance is coupled between body nodes of a pair of successive FET unit cell circuits.

10. The device of claim 7, further comprising a gate bias network filter circuit having a plurality of gate bias network resistances in parallel with each other with respect to a common node of the gate bias network filter circuit, each gate bias network resistance corresponding to one of the plurality of FET unit cell circuits, each gate bias network resistance connected between the common node and a gate node of a corresponding FET unit cell circuit.

11. The device of claim 7, further comprising a gate bias network filter circuit having a plurality of gate bias network resistances in series with each other, and each gate bias network resistance is coupled between gate nodes of a pair of successive FET unit cell circuits.

12. The device of claim 7, wherein:
 the body bias network filter circuit comprises a body bias network capacitor and a plurality of body bias network resistances in parallel with each other with respect to a common node of the body bias network filter circuit, each body bias network resistance corresponding to one of the plurality of FET unit cell circuits, each body bias network resistance connected between the common node of the body bias network filter circuit and the body node of a corresponding FET unit cell circuit, the body bias network capacitor coupled between the mid-node and the common node of the body bias network filter circuit; and
 a gate bias network filter circuit comprises a gate bias network capacitor and a plurality of gate bias network resistances in parallel with each other with respect to a common node of the gate bias network filter circuit, each gate bias network resistance corresponding to one of the plurality of FET unit cell circuits, each gate bias network resistance connected between the common node of the gate bias network filter circuit and a gate node of a corresponding FET unit cell circuit, the gate bias network capacitor coupled between the mid-node and the common node of the gate bias network filter circuit.

13. The device of claim 7, wherein:

the body bias network filter circuit comprises a body bias network capacitor and a plurality of body bias network resistances in parallel with each other with respect to a common node of the body bias network filter circuit, each body bias network resistance corresponding to one of the plurality of FET unit cell circuits, each body bias network resistance connected between the common node of the body bias network filter circuit and the body node of a corresponding FET unit cell circuit, the body bias network capacitor coupled between the mid-node and the common node of the body bias network filter circuit; and a gate bias network filter circuit comprises a gate bias network capacitor and a plurality of gate bias network resistances in series with each other, and each gate bias network resistance is coupled between the gate nodes of a pair of successive FET unit cell circuits, the gate bias network capacitor coupled between the mid-node and a common node of the gate bias network filter circuit.

14. The device of claim 7, wherein:

the body bias network filter circuit comprises a body bias network capacitor and a plurality of body bias network resistances in series with each other, and each body bias network resistance is coupled between body nodes of a pair of successive FET unit cell circuits, the body bias network capacitor coupled between the mid-node and a common node of the body bias network filter circuit; and a gate bias network filter circuit comprises a gate bias network capacitor and a plurality of gate bias network resistances in parallel with each other with respect to a common node of the gate bias network filter circuit, each gate bias network resistance corresponding to one of the plurality of FET unit cell circuits, each gate bias network resistance connected between the common node and a gate node of a corresponding FET unit cell circuit, the gate bias network capacitor coupled between the mid-node and the common node of the gate bias network filter circuit.

15. The device of claim 7, wherein:

the body bias network filter circuit comprises a body bias network capacitor and a plurality of body bias network resistances in series with each other, and each body bias network resistance is coupled between body nodes of a pair of successive FET unit cell circuits, the body bias network capacitor coupled between the mid-node and a common node of the body bias network filter circuit; and a gate bias network filter circuit comprises a gate bias network capacitor and a plurality of gate bias network resistances in series with each other, and each gate bias network resistance is coupled between gate nodes of a pair of successive FET unit cell circuits, the gate bias network capacitor coupled between the mid-node and a common node of the gate bias network filter circuit.

* * * * *